United States Patent
Katsunuma et al.

(10) Patent No.: US 11,476,123 B2
(45) Date of Patent: Oct. 18, 2022

(54) ETCHING METHOD, PLASMA PROCESSING APPARATUS, AND SUBSTRATE PROCESSING SYSTEM

(71) Applicant: Tokyo Electron Limited, Tokyo (JP)

(72) Inventors: Takayuki Katsunuma, Miyagi (JP); Masanobu Honda, Miyagi (JP); Yuta Nakane, Miyagi (JP); Shinya Ishikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/015,088

(22) Filed: Sep. 9, 2020

(65) Prior Publication Data

US 2021/0082713 A1    Mar. 18, 2021

(30) Foreign Application Priority Data

Sep. 13, 2019  (JP) .............................. JP2019-167063
Jul. 15, 2020  (JP) .............................. JP2020-121613

(51) Int. Cl.
*H01L 21/311*  (2006.01)
*H01J 37/32*   (2006.01)

(52) U.S. Cl.
CPC .. *H01L 21/31138* (2013.01); *H01J 37/32082* (2013.01); *H01J 37/32449* (2013.01); *H01L 21/31144* (2013.01); *H01J 2237/334* (2013.01)

(58) Field of Classification Search
CPC ......... H01L 21/31138; H01L 21/31144; H01L 21/31116
See application file for complete search history.

(56) References Cited

U.S. PATENT DOCUMENTS

| 10,256,320 B1* | 4/2019 | Liu ................... H01L 29/42392 |
| 2009/0286400 A1* | 11/2009 | Heo ..................... H01L 21/0273 438/694 |
| 2012/0322234 A1* | 12/2012 | Yalamanchili ....... B23K 26/364 438/462 |
| 2016/0343580 A1* | 11/2016 | Hudson ............. H01J 37/32091 |
| 2018/0342401 A1* | 11/2018 | Koiwa .............. H01J 37/32091 |
| 2020/0075319 A1* | 3/2020 | Chang ............... H01L 21/76877 |

FOREIGN PATENT DOCUMENTS

JP      2015-012178 A      1/2015

* cited by examiner

*Primary Examiner* — Binh X Tran
(74) *Attorney, Agent, or Firm* — Xsensus LLP

(57) ABSTRACT

An etching method includes (a) performing a plasma etching on an organic film, having a mask formed thereon, to form a recess in the organic film; (b) forming an organic protective film on a side wall surface of the recess in the organic film; and (c) performing an additional plasma etching on the organic film after (b).

19 Claims, 13 Drawing Sheets

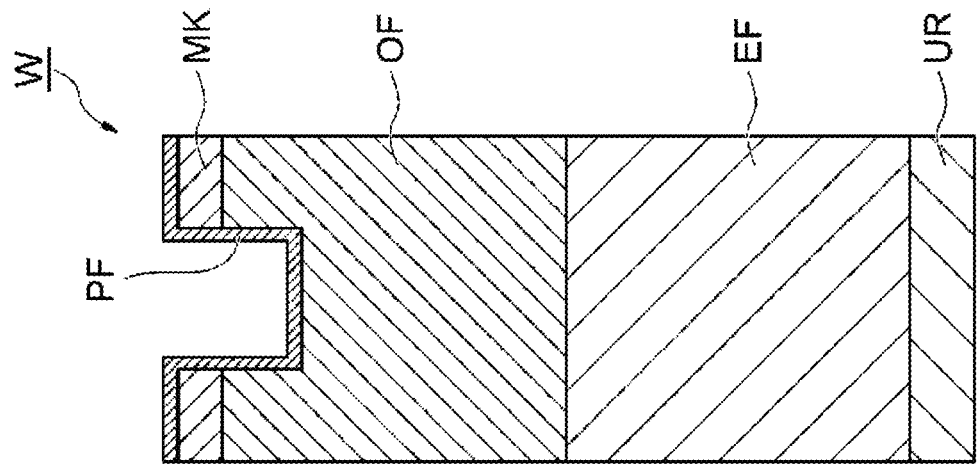
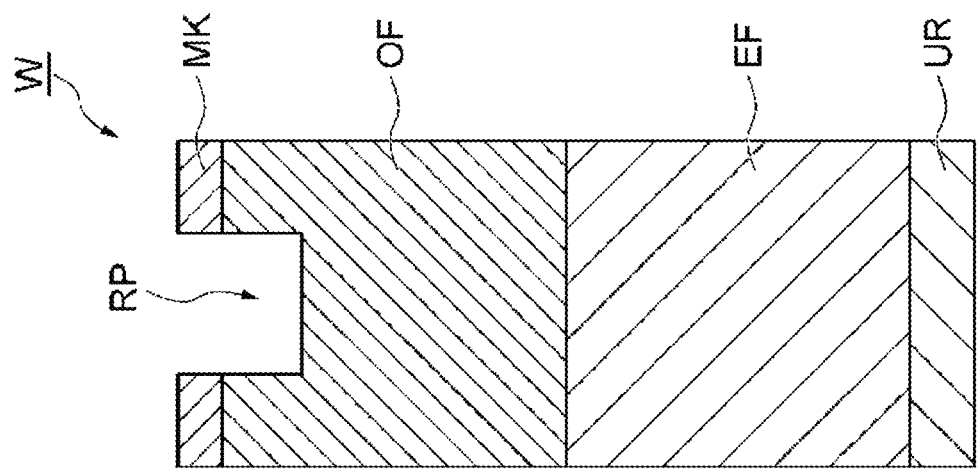

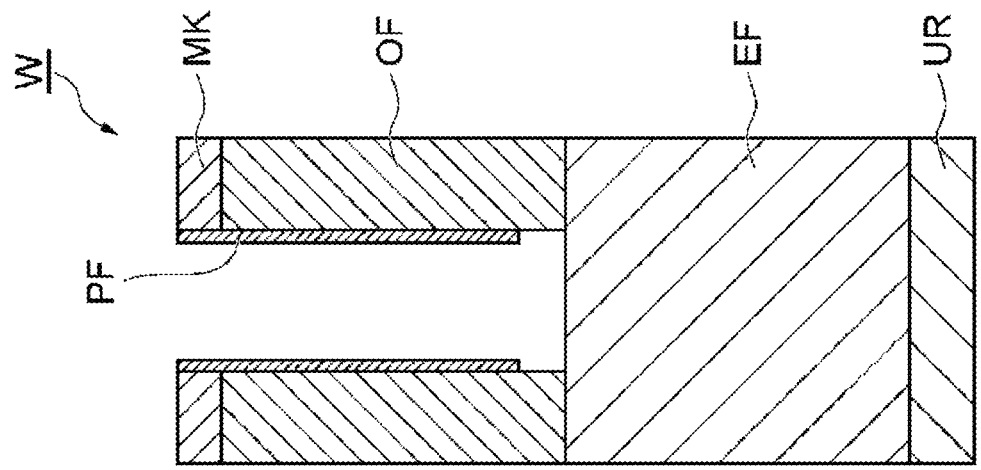
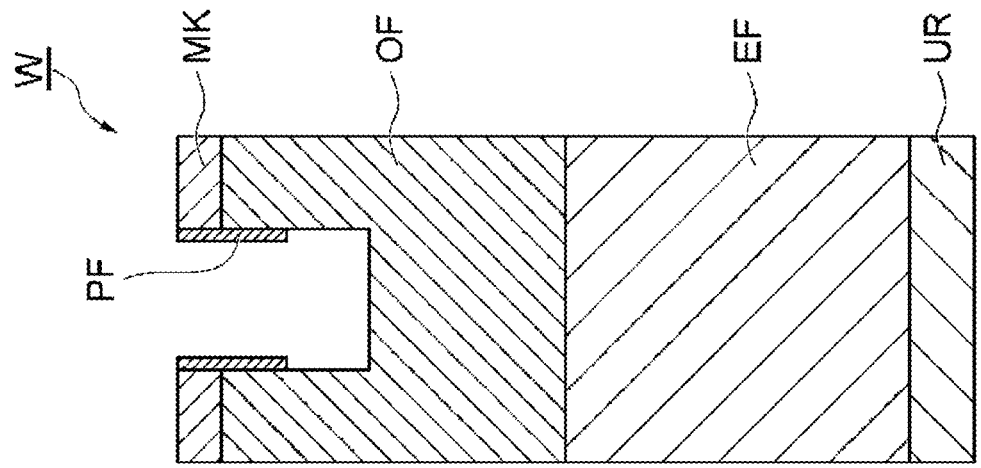

ETCHING METHOD, PLASMA PROCESSING APPARATUS, AND SUBSTRATE PROCESSING SYSTEM

CROSS-REFERENCE TO RELATED APPLICATIONS

This application is based on and claims priority from Japanese Patent Application Nos. 2019-167063 and 2020-121613, filed on Sep. 13, 2019 and Jul. 15, 2020, respectively, with the Japan Patent Office, the disclosures of each are incorporated by reference in their entireties.

TECHNICAL FIELD

The present disclosure relates to an etching method, a plasma processing apparatus, and a substrate processing system.

BACKGROUND

Japanese Laid-Open Patent Publication No. 2015-012178 discloses a plasma etching of an organic film. The plasma etching of Japanese Laid-Open Patent Publication No. 2015-012178 uses a mixed gas containing oxygen gas, carbonyl sulfate gas, and chlorine gas. The organic film is etched in the manner that sulfur and silicon chloride adhere to the side wall surface of the organic film. Accordingly, a recess formed by the etching of the organic film is suppressed from being laterally expanded. That is, a bowing is suppressed so that the shape of the recess is improved.

SUMMARY

An aspect of the present disclosure provides an etching method. The etching method includes (a) performing a plasma etching on an organic film. A mask is provided on the organic film. A recess is formed in the organic film by the plasma etching. The etching method further includes (b) forming an organic protective film on a side wall surface of the organic film that defines the recess. The etching method further includes (c) performing an additional plasma etching on the organic film after (b) is performed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5A is a partial enlarged cross-sectional view of an example of the substrate in a state after step ST1 of the etching method illustrated in FIG. 1 is performed, and FIG. 5B is a partial enlarged cross-sectional view of an example of the substrate in a state after step ST2 of the etching method illustrated in FIG. 1 is performed.

FIG. 6A is a partial enlarged cross-sectional view of an example of the substrate in a state after step ST3 of the etching method illustrated in FIG. 1 is performed, and FIG. 6B is a partial enlarged cross-sectional view of an example of the substrate in a state when an etching of an organic film is ended.

DETAILED DESCRIPTION

Figure 1:
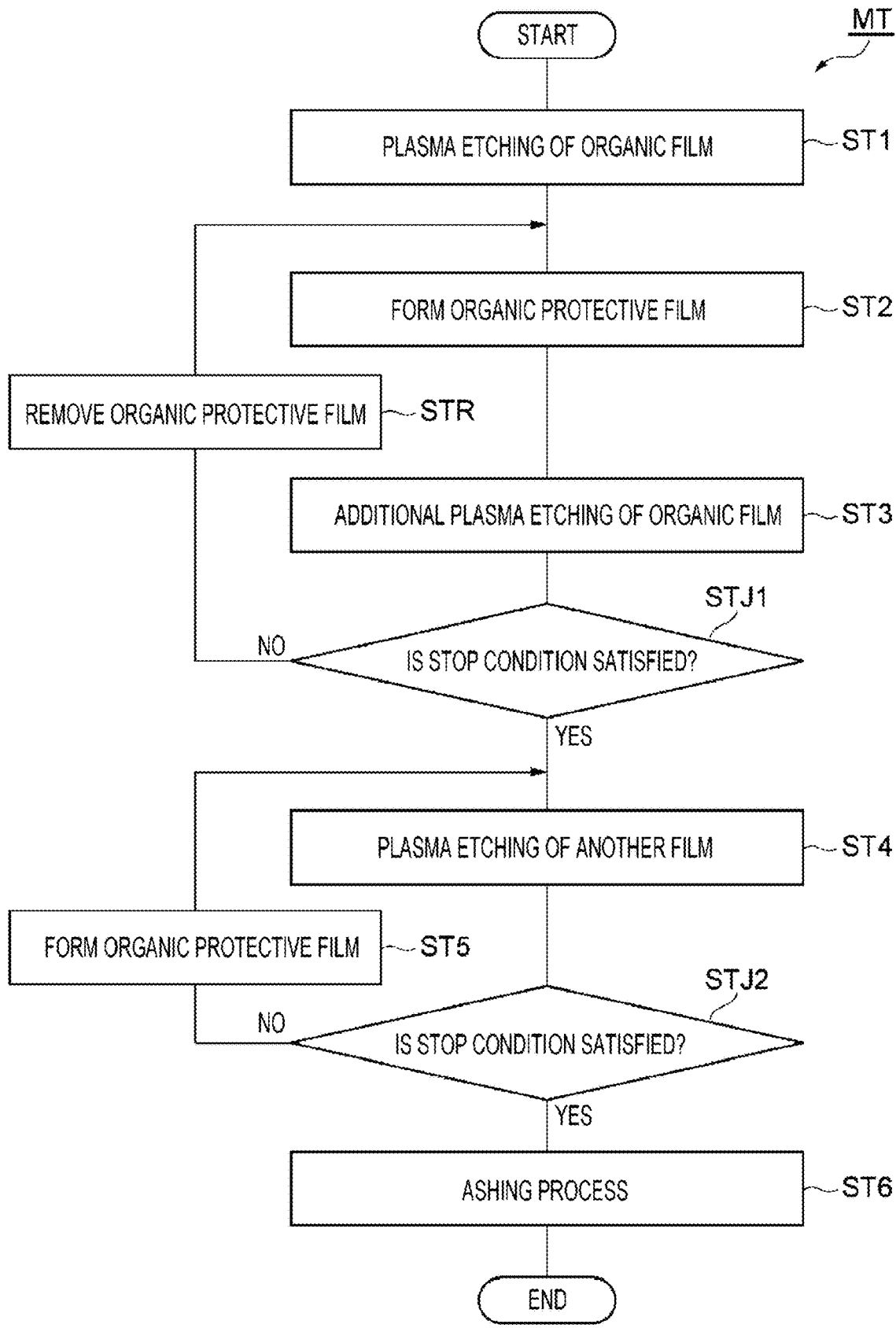
FIG. 1 is a flowchart of an etching method according to an embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments of the present disclosure will be described.

An embodiment of the present disclosure provides an etching method. The etching method includes (a) performing a plasma etching on an organic film. A mask is provided on the organic film. A recess is formed in the organic film by the plasma etching. The etching method further includes (b) forming an organic protective film on a side wall surface of the organic film that defines the recess. The etching method further includes (c) performing an additional plasma etching on the organic film after (b) is performed.

In the etching method of the embodiment described above, the organic film and the organic protective film are formed of an organic material. Accordingly, the organic protective film may be easily removed together with the organic film. The organic protective film is formed on the side wall surface of the organic film after a recess is formed in the organic film. The organic film is further etched in a state where the organic protective film protects the side wall surface. Thus, the occurrence of bowing caused from the plasma etching of the organic film may be suppressed by the protective film that is easily removed together with the organic film.

In an embodiment, (b) and (c) may be alternately repeated.

In an embodiment, the mask may contain silicon.

In an embodiment, (b) may be started when an aspect ratio of the recess is 5 or lower. According to this embodiment, the occurrence of bowing in the organic film is more effectively suppressed.

In an embodiment, the organic protective film may be conformally formed on the surface of the substrate including the organic film in a state after (a) is performed.

In an embodiment, the organic film may be provided on another film. In this embodiment, the etching method may further include (d) performing a plasma etching on the another film after the another film is partially exposed by (c).

In an embodiment, the etching method may further include (e) performing an ashing process for removing the organic film after (d) is ended. In the ashing process, the organic protective film is removed together with the organic film.

In an embodiment, the etching method may include (f) forming an additional organic protective film on the side wall surface that defines the recess continuous in the organic film and the another film, after (d) is performed. In this embodiment, (d) may be additionally performed after (f) is performed.

Another embodiment of the present disclosure provides a plasma processing apparatus for etching an organic film. A mask is provided on the organic film. The plasma processing apparatus includes a chamber, a substrate support, a gas supply, a radio-frequency power supply, and a controller. The substrate support is provided inside the chamber. The gas supply is configured to supply a precursor gas containing a carbon and a processing gas for etching the organic film into the chamber. The radio-frequency power supply is configured to generate a radio-frequency power in order to generate plasma from a gas inside the chamber. The controller is configured to control the gas supply and the radio-frequency power supply. The controller controls the gas supply to supply a processing gas into the chamber in order to form a recess in the organic film by a plasma etching on the organic film, and controls the radio-frequency power supply to supply a radio-frequency power in order to generate plasma from the processing gas. The controller controls the gas supply to supply a precursor gas into the chamber in order to form an organic protective film on the side wall surface of the organic film that defines the recess. The controller controls the gas supply to supply a processing gas into the chamber in order to perform an additional plasma etching on the organic film, and controls the radio-frequency power supply to supply a radio-frequency power in order to generate plasma from the processing gas.

Yet another embodiment of the present disclosure provides a substrate processing system for etching an organic film of a substrate. The substrate has an organic film and a mask. The mask is provided on the organic film. The substrate processing system includes one or more plasma processing apparatuses, a film forming apparatus, a transfer module, and a controller. The transfer module is configured to provide a depressurizable space connected to the one or more plasma processing apparatuses and the film forming apparatus, and transfer a substrate to the one or more plasma processing apparatuses and the film forming apparatus through the space. The controller is configured to control the one or more plasma processing apparatuses, the film forming apparatus, and the transfer module. The controller controls the transfer module to transfer the substrate to one plasma processing apparatus of the one or more plasma processing apparatuses. The controller controls the one plasma processing apparatus to generate plasma of a processing gas in order to form a recess in the organic film by a plasma etching on the organic film. The controller controls the transfer module to transfer the substrate that has been subjected to the plasma etching, to the film forming apparatus. The controller controls the film forming apparatus to perform a film forming process for forming an organic protective film on a side wall surface of the organic film that defines the recess. The controller controls the transfer module to transfer the substrate that has been subjected to the film forming process to one plasma processing apparatus of the one or more plasma processing apparatuses. The controller controls the one plasma processing apparatus to which the substrate that has been subjected to the film forming process is transferred, to generate plasma of a processing gas in order to perform an additional plasma etching on the organic film.

Hereinafter, various embodiments will be described in detail with reference to the drawings. In the respective drawings, similar or corresponding portions will be denoted by the same reference numerals.

Figure 2:
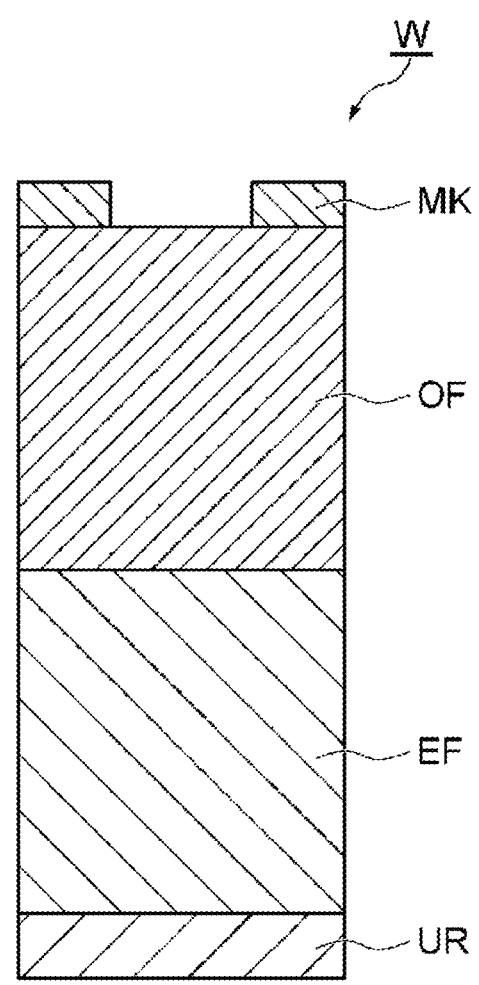
FIG. 2 is a partial enlarged cross-sectional view of an example of a substrate.

FIG. 1 is a flowchart of an etching method according to an embodiment. The etching method illustrated in FIG. 1 (hereinafter, referred to as the "method MT") performs an etching on an organic film of a substrate in steps ST1 to ST3. FIG. 2 is a partially enlarged cross-sectional view of an example of the substrate. The method MT may be applied to the substrate W illustrated in FIG. 2. The substrate W illustrated in FIG. 2 has an organic film OF and a mask MK. The organic film OF is formed of an organic material, and contains carbons. The organic film OF is, for example, a spin-on carbon film or an amorphous carbon film. The organic film OF may have a thickness of 3 μm or more.

The mask MK is provided on the organic film OF. The mask MK has a pattern to be transferred to the organic film OF. That is, the mask MK provides an opening through which the organic film OF is partially exposed. The mask MK may contain silicon. The mask MK may be, for example, an antireflection film containing silicon. Alternatively, the mask MK may be a SiON film. The pattern of the mask MK may be formed by a plasma etching using a patterned photoresist mask.

As illustrated in FIG. 2, the substrate W may further have another film EF and an underlying region UR. The film EF is provided on the underlying region UR. The film EF may be a silicon-containing film. The film EF may be a silicon-containing dielectric film, and may be, for example, a silicon oxide film. The organic film OF is provided on the film EF.

Figure 3:
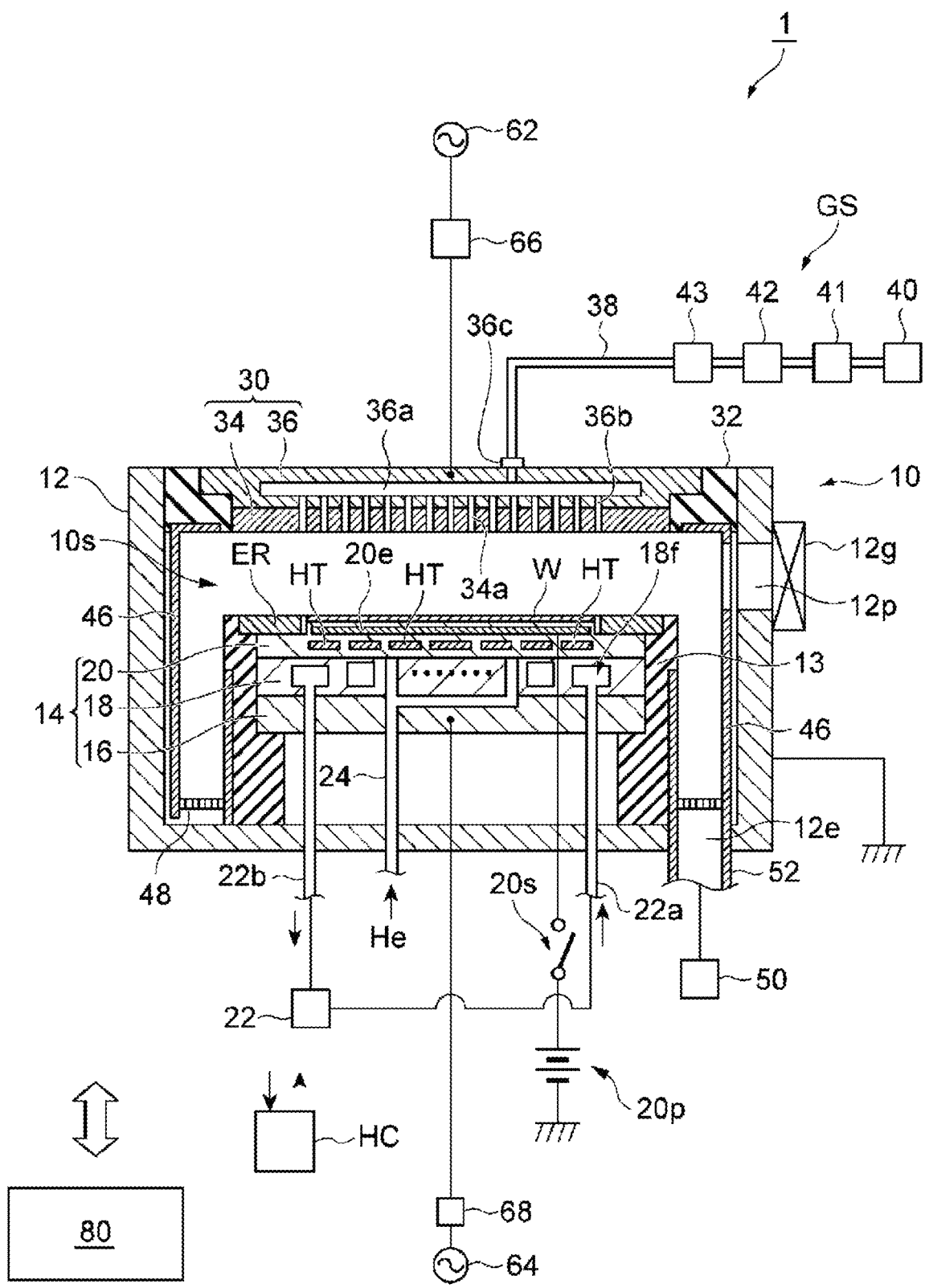
FIG. 3 is a view schematically illustrating a plasma processing apparatus according to an embodiment.

The method MT is performed using a plasma processing apparatus. FIG. 3 is a view schematically illustrating a plasma processing apparatus according to an embodiment. The method MT may be performed using a plasma processing apparatus 1 illustrated in FIG. 3. The plasma processing apparatus 1 is a capacitively coupled plasma processing apparatus. The plasma processing apparatus 1 includes a chamber 10. The chamber 10 provides an internal space 10s therein.

That chamber 10 includes a chamber body 12. The chamber body 12 has a substantially cylindrical shape. The internal space 10s is provided inside the chamber body 12. The chamber body 12 is formed of a conductor such as aluminum. The chamber body 12 is grounded. A corrosion-resistant film is provided on the inner wall surface of the chamber body 12. The corrosion-resistant film may be formed of ceramic such as aluminum oxide or yttrium oxide.

A passage 12p is formed in the side wall of the chamber body 12. The substrate W passes through the passage 12p when being transferred between the internal space 10s and the outside of the chamber 10. The passage 12p is openable/closable by a gate valve 12g. The gate valve 12g is provided along the side wall of the chamber body 12.

A support 13 is provided on the bottom of the chamber body 12. The support 13 is formed of an insulating material.

The support 13 has a substantially cylindrical shape. The support 13 extends upward from the bottom of the chamber body 12 inside the inner space 10s. The support 13 supports the substrate support 14. The substrate support 14 is configured to support the substrate W inside the chamber 10, that is, in the internal space 10s.

The substrate support 14 is provided inside the chamber 10. The substrate support 14 includes a lower electrode 18 and an electrostatic chuck 20. The substrate support 14 may further include an electrode plate 16. The electrode plate 16 is formed of a conductor such as aluminum, and has a substantially disc shape. The lower electrode 18 is provided on the electrode plate 16. The lower electrode 18 is formed of, for example, a conductor such as aluminum, and has a substantially disc shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body formed of a dielectric material. The main body of the electrostatic chuck 20 has a substantially disc shape. The electrostatic chuck 20 further includes an electrode 20e. The electrode 20e is provided in the main body of the electrostatic chuck 20. The electrode 20e is a film-shaped electrode. The electrode 20e is connected to a DC power supply 20p via a switch 20s. When a voltage is applied from the DC power supply 20p to the electrode of the electrostatic chuck 20, an electrostatic attractive force is generated between the electrostatic chuck 20 and the substrate W. The substrate W is attracted to and held on the electrostatic chuck 20 by the generated electrostatic attractive force.

An edge ring ER is disposed on the substrate support 14. Without being limited, the edge ring FR may be formed of silicon, silicon carbide, or quartz. When the processing of the substrate W is performed in the chamber 10, the substrate W is placed on the electrostatic chuck 20 and in the region surrounded by the edge ring FR.

A flow path 18f is provided inside the lower electrode 18. A heat exchange medium (e.g., a coolant) is supplied to the flow path 18f from a chiller unit 22 via a pipe 22a. The chiller unit 22 is provided outside the chamber 10. The heat exchange medium supplied to the flow path 18f is returned to the chiller unit 22 through a pipe 22b. In the plasma processing apparatus 1, the temperature of the substrate W placed on the electrostatic chuck 20 is adjusted by a heat exchange between the heat exchange medium and the lower electrode 18.

The temperature of the substrate W may be adjusted by one or more heaters provided inside the substrate support 14. In the example illustrated in FIG. 3, a plurality of heaters HT is provided inside the electrostatic chuck 20. Each of the plurality of heaters HT may be a resistance heating element.

Figure 4:
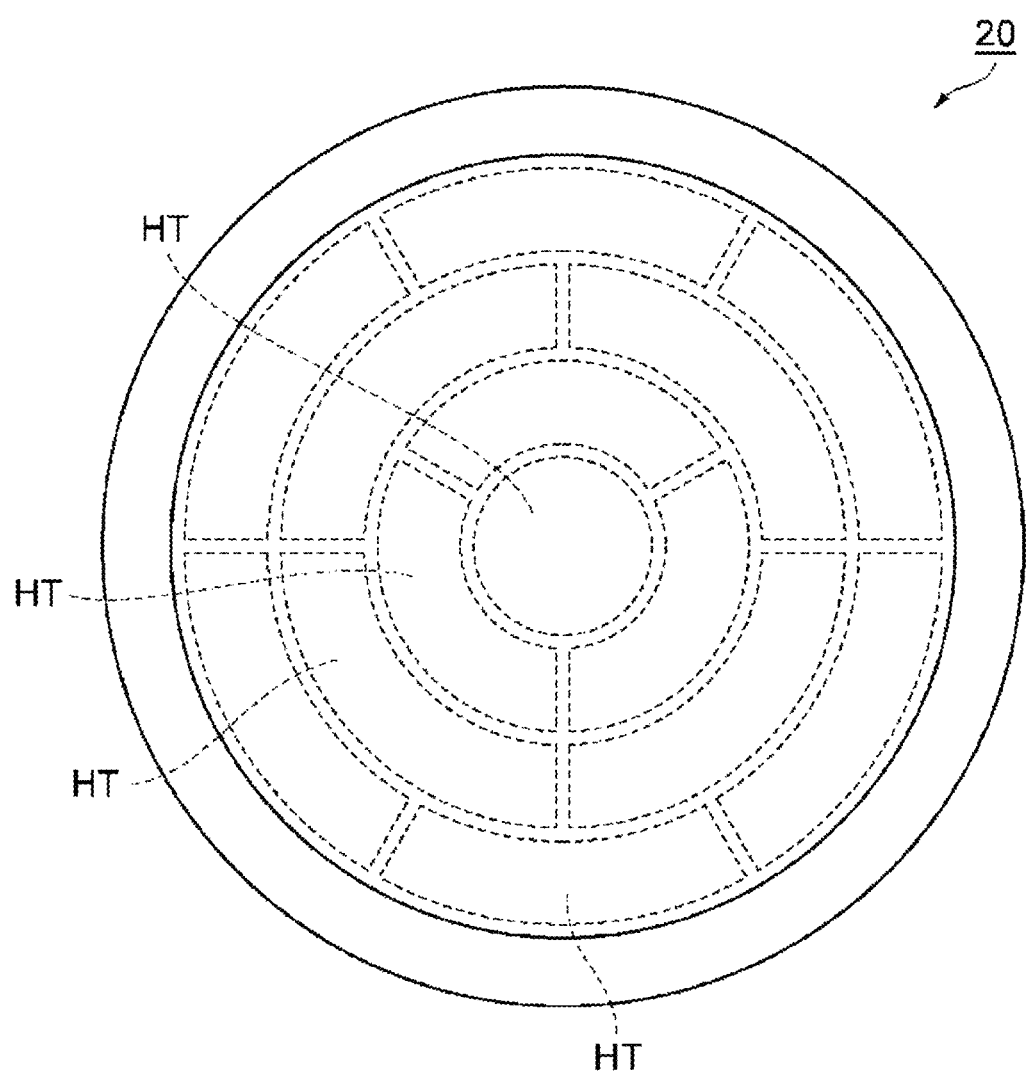
FIG. 4 is a view illustrating an example of a layout of a plurality of heaters in the plasma processing apparatus illustrated in FIG. 3.

FIG. 4 is a view illustrating an example of a layout of the plurality of heaters in the plasma processing apparatus illustrated in FIG. 3. As illustrated in FIG. 4, the plurality of heaters HT is arranged in a plurality of regions within the main body of the electrostatic chuck 20. The plurality of regions within the main body of the electrostatic chuck 20 includes the central region of the main body of the electrostatic chuck 20. At least one of the plurality of heaters HT is disposed in the central region. The plurality of regions within the main body of the electrostatic chuck 20 includes a plurality of annular regions that extend circumferentially to surround the central region. The plurality of annular regions shares the central axis with the central region, and extends coaxially. One or more heaters among the plurality of heaters HT are provided in each of the plurality of annular regions.

As illustrated in FIG. 3, the plurality of heaters HT is connected to a heater controller HC. The heater controller HC is configured to supply a regulated amount of power to each of the plurality of heaters HT.

The plasma processing apparatus 1 may further include a gas supply line 24. The gas supply line 24 supplies a heat transfer gas (e.g., He gas) to the space between the upper surface of the electrostatic chuck 20 and the rear surface of the substrate W. The heat transfer gas is supplied from a heat transfer gas supply mechanism to the gas supply line 24.

The plasma processing apparatus 1 further includes an upper electrode 30. The upper electrode 30 is provided above the substrate support 14. The upper electrode 30 is supported in the upper portion of the chamber body 12 via a member 32. The member 32 is formed of a material having an insulating property. The upper electrode 30 and the member 32 close the upper opening of the chamber body 12.

The upper electrode 30 may include a top plate 34 and a support 36. The lower surface of the top plate 34 is close to the internal space 10s, and defines the internal space 10s. The top plate 34 may be formed of a silicon-containing material. The top plate 34 is made of, for example, silicon or silicon carbide. The top plate 34 is provided with a plurality of gas injection holes 34a. The plurality of gas injection holes 34a penetrates the top plate 34 in the thickness direction of the plate.

The support 36 detachably supports the top plate 34. The support 36 is formed of a conductive material such as aluminum. A gas diffusion chamber 36a is formed inside the support 36. A plurality of gas holes 36b is formed in the support 36. The plurality of gas holes 36b extends downward from the gas diffusion chamber 36a. The plurality of gas holes 36b communicates with the plurality of gas injection holes 34a, respectively. A gas inlet port 36c is formed in the support 36. The gas inlet port 36c is connected to the gas diffusion chamber 36a. A gas supply pipe 38 is connected to the gas inlet port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 make up a gas supply GS. The gas source group 40 includes a plurality of gas sources. The plurality of gas sources in the gas source group 40 includes a plurality of gas sources used in the method MT. Each of the valve group 41 and the valve group 43 includes a plurality of opening/closing valves. The flow rate controller group 42 includes a plurality of flow rate controllers. Each of the plurality of flow rate controllers in the flow rate controller group 42 is a mass flow rate controller or a pressure control type flow rate controller. Each of the plurality of gas sources in the gas source group 40 is connected to the gas supply pipe 38 via a corresponding opening/closing valve of the valve group 41, a corresponding flow rate controller of the flow rate controller group 42, and a corresponding opening/closing valve of the valve group 43.

In the plasma processing apparatus 1, a shield 46 is detachably provided along the inner wall surface of the chamber body 12. The shield 46 is also provided on the outer periphery of the support 13. The shield 46 suppresses byproducts of the plasma processing from adhering to the chamber body 12. The shield 46 is configured by forming a corrosion-resistant film on the surface of a member formed of, for example, aluminum. The corrosion-resistant film may be a film formed of ceramic such as yttrium oxide.

A baffle member 48 is provided between the support 13 and the side wall of the chamber body 12. The baffle member 48 is configured by forming a corrosion-resistant film on the surface of a plate-shaped member formed of, for example, aluminum. The corrosion-resistant film may be a film formed of ceramic such as yttrium oxide. The baffle member 48 has a plurality of through holes. An exhaust port 12e is formed in the bottom of the chamber body 12 below the baffle plate 48. An exhaust device 50 is connected to the exhaust port 12e via an exhaust pipe 52. The exhaust device 50 includes a pressure regulation valve and a vacuum pump such as a turbo molecular pump.

The plasma processing apparatus 1 further includes a first radio-frequency power supply 62 and a second radio-frequency power supply 64. The first radio-frequency power supply 62 generates a first radio-frequency power. The first radio-frequency power has a frequency suitable for generating plasma. The frequency of the first radio-frequency power falls in a range of, for example, 27 MHz to 100 MHz. The first radio-frequency power supply 62 is connected to the upper electrode 30 via a matching unit 66. The matching unit 66 includes a circuit for matching the impedance of a load side (the upper electrode 30) of the first radio-frequency power supply 62 with the output impedance of the first radio-frequency power supply 62. The first radio-frequency power supply 62 may be connected to the lower electrode 18 via the matching unit 66.

The second radio-frequency power supply 64 generates a second radio-frequency power. The second radio-frequency power has a frequency lower than the frequency of the first radio-frequency power. The second radio-frequency power may be used as a bias radio-frequency power for drawing ions to the substrate W. The frequency of the second radio-frequency power falls in a range of, for example, 400 kHz to 40.68 MHz. In an example, the frequency of the second radio-frequency power may be 3.2 MHz. The second radio-frequency power supply 64 is connected to the lower electrode 18 via a matching unit 68 and the electrode plate 16. The matching unit 68 includes a circuit for matching the impedance of a load side (the lower electrode 18) of the second radio-frequency power supply 64 with the output impedance of the second radio-frequency power supply 64. The plasma processing apparatus 1 may be configured to generate plasma using only one of the first radio-frequency power supply 62 and the second radio-frequency power supply 64.

The plasma processing apparatus 1 further includes a controller 80. The controller 80 may be a computer including a processor, a storage unit such as a memory, an input device, a display device, a signal input/output interface and others. The controller 80 controls each unit of the plasma processing apparatus 1. In the controller 80, an operator may perform a command input operation or the like using the input device in order to manage the plasma processing apparatus 1. Further, in the controller 80, the display device may visualize and display an operation status of the plasma processing apparatus 1. The storage unit of the controller 80 stores a control program and recipe data. The processor of the controller 80 executes the control program in order to perform various types of processing in the plasma processing apparatus 1. When the processor of the controller 80 executes the control program to control each unit of the plasma processing apparatus 1 according to recipe data, at least a portion or all of the steps of the method MT are performed in the plasma processing apparatus 1.

Figure 7A:
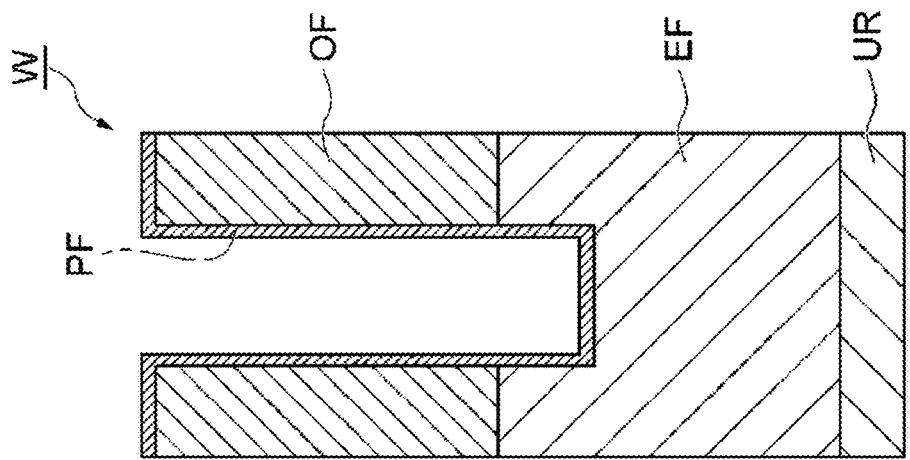
FIG. 7A is a partial enlarged cross-sectional view of an example of the substrate in a state after step ST4 of the etching method illustrated in FIG. 1 is performed.
Figure 7B:
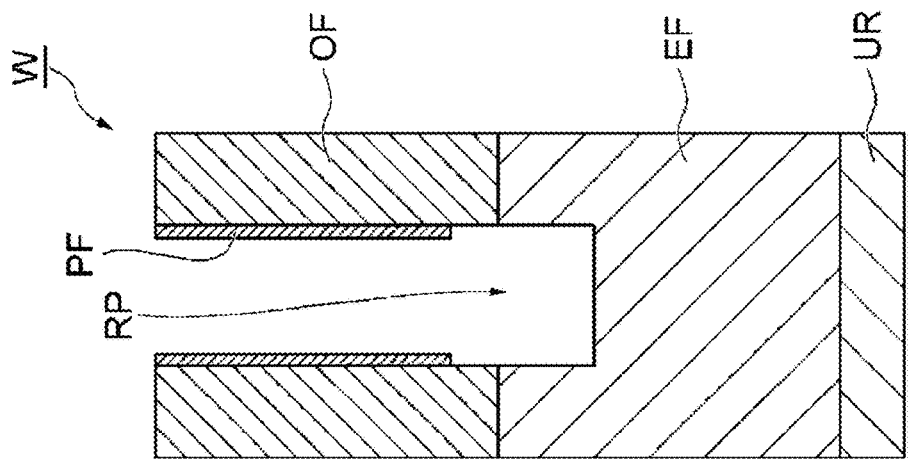
FIG. 7B is a partial enlarged cross-sectional view of an example of the substrate in a state after step ST5 of the etching method illustrated in FIG. 1 is performed.
Figure 8B:
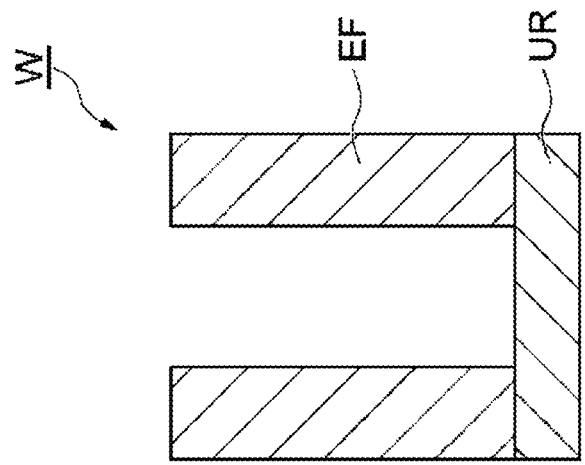
FIG. 8B is a partial enlarged cross-sectional view of an example of the substrate in a state after step ST6 of the etching method illustrated in FIG. 1 is performed.
Figure 8A:
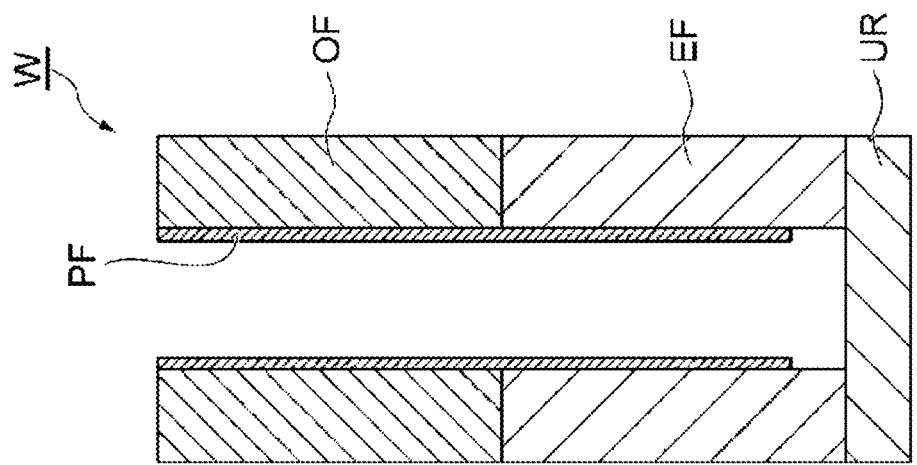
FIG. 8A is a partial enlarged cross-sectional view of an example of the substrate in a state when an etching of a film EF is ended.

Referring back to FIG. 1, the method MT will be described in detail. Hereinafter, the method MT will be described by taking a case where the method MT is applied to the substrate W illustrated in FIG. 2 using the plasma processing apparatus 1 as an example. In the following descriptions, FIGS. 5A, 5B, 6A, 6B, 7A, 7B, 8A, and 8B will be referred. FIG. 5A is a partial enlarged cross-sectional view of an example of the substrate in a state after step ST1 of the etching method illustrated in FIG. 1 is performed, and FIG. 5B is a partial enlarged cross-sectional view illustrating an example of the substrate in a state after step ST2 of the etching method illustrated in FIG. 1 is performed. FIG. 6A is a partial enlarged cross-sectional view of an example of the substrate in a state after step ST3 of the etching method illustrated in FIG. 1 is performed, and FIG. 6B is a partial enlarged cross-sectional view illustrating an example of the substrate in a state when the etching of the organic film is ended. FIG. 7A is a partial enlarged cross-sectional view illustrating an example of the substrate in a state after step ST4 of the etching method illustrated in FIG. 1 is performed, and FIG. 7B is a partial cross-sectional view illustrating an example of the substrate in a state after step ST5 of the etching method illustrated in FIG. 1 is performed. FIG. 8A is a partial enlarged cross-sectional view illustrating an example of the substrate in a state when an etching of the film EF is ended, and FIG. 8B is a partial cross-sectional view illustrating an example of the substrate in a state after step ST6 of the etching method illustrated in FIG. 1 is performed.

In the method MT, the substrate W illustrated in FIG. 2 is placed on the substrate support 14 1 (e.g., the electrostatic chuck 20) of the plasma processing apparatus. In step ST1 of the method MT, a plasma etching of the organic film OF is performed. In step ST1, a processing gas is supplied into the chamber 10. The processing gas used in step ST1 may be an oxygen-containing gas. The oxygen-containing gas is, for example, oxygen gas. The processing gas used in step ST1 may further contain other gases such as COS gas, in addition to the oxygen-containing gas. Alternatively, the processing gas used in step ST1 may be a mixed gas containing nitrogen gas and hydrogen gas. In step ST1, the first radio-frequency power and/or the second radio-frequency power are supplied, and plasma is generated from the processing gas in the chamber 10. The organic film OF is etched by chemical species from the generated plasma. As illustrated in FIG. 5A, a recess RP is formed in the organic film OF by the plasma etching in step ST1.

The plasma etching in step ST1 is stopped before the bottom of the recess RP reaches the boundary between the film EF and the organic film OF. In an embodiment, the plasma etching in step ST1 is stopped when the aspect ratio of the recess RP is 5 or lower. In other words, step ST2 which is subsequent to step ST1 as described later is started when the aspect ratio of the recess RP is 5 or lower. This is intended to protect the organic film OF from the lateral etching near the interface between the mask MK and the organic film OF. Here, the aspect ratio is defined as a value obtained by dividing the depth of the recess RP by the width of the recess RP.

In order to perform step ST1, the controller 80 controls the gas supply GS to supply the processing gas into the chamber 10. In order to perform step ST1, the controller 80 controls the exhaust device 50 to set the pressure in the chamber 10 to a designated pressure. In order to perform step ST1, the controller 80 controls the first radio-frequency power supply 62 and/or the second radio-frequency power supply 64 to supply the first radio-frequency power and/or the second radio-frequency power.

In subsequent step ST2, as illustrated in FIG. 5B, an organic protective film PF is formed on the side wall surface of the organic film OF that defines the recess RP. The organic protective film PF is formed of an organic material, and contains carbons. The organic protective film PF may not or may contain silicon. The material of the organic protective film PF may be different from the material of the organic film OF. The density of the organic protective film PF may be higher than the density of the organic film OF. Here, the density is defined as the content of carbon atoms per unit volume.

Figure 9:
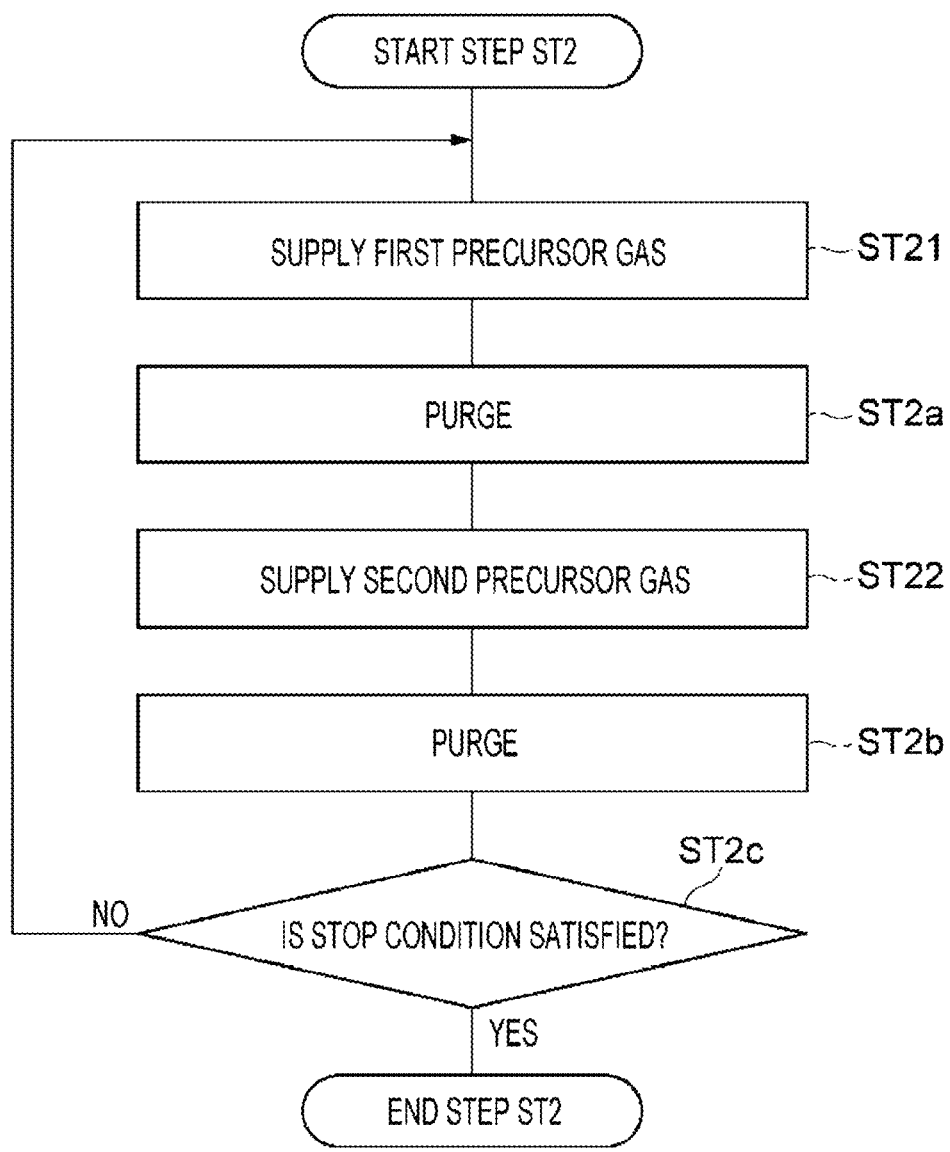
FIG. 9 is a flowchart of an example of step ST2 of the etching method illustrated in FIG. 1.

The organic protective film PF may be formed by any film forming method. In an embodiment, the organic protective film PF is conformally formed on the surface of the substrate W. The organic protective film PF may be formed by CVD or plasma CVD. FIG. 9 is a flowchart illustrating an example of step ST2 of the etching method illustrated in FIG. 1. In the example illustrated in FIG. 9, step ST2 includes steps ST21 and ST22. Step ST2 may further include steps ST2$a$ and ST2$b$.

In step ST21, a first precursor gas is supplied to the substrate W. The first precursor gas contains a first organic compound. In step ST21, the first organic compound is adsorbed onto the surface of the substrate W. In step ST21, the first precursor gas may be supplied to the substrate W without generating plasma then. Alternatively, in step ST21, plasma may be generated from the first precursor gas, and chemical species in the plasma may be adsorbed as the first organic compound onto the surface of the substrate W. In order to perform step ST21, the controller 80 controls the gas supply GS to supply the first precursor gas into the chamber 10. In order to perform step ST21, the controller 80 controls the exhaust device 50 to set the pressure in the chamber 10 to a designated pressure. When plasma is generated from the first precursor gas in step ST21, the controller 80 controls the first radio-frequency power supply 62 and/or the second radio-frequency power supply 64 to supply the first radio-frequency power and/or the second radio-frequency power.

Step ST2$a$ is performed between steps ST21 and ST22. In step ST2$a$, purging of the internal space 10$s$ is performed. That is, the gas in the internal space 10$s$ is discharged. In step ST2$a$, an inert gas such as a rare gas or nitrogen gas may be supplied from the gas supply GS into the chamber 10. When step ST2$a$ is performed, the first organic compound that has been excessively deposited on the substrate W is removed. In order to perform step ST2$a$, the controller 80 controls the exhaust device 50. The controller 80 may further control the gas supply GS to supply the inert gas into the chamber 10. Step ST2$a$ may not be performed.

In step ST22, a second precursor gas is supplied to the substrate W. The second precursor gas contains a second organic compound. In step ST2, an organic compound that makes up the organic protective film PF is generated by a polymerization of the first organic compound and the second organic compound. In step ST22, the second precursor gas may be supplied to the substrate W without generating plasma then. Alternatively, in step ST22, plasma may be generated from the second precursor gas, and chemical species in the plasma may be supplied as the second organic compound to the substrate W. In order to perform step ST22, the controller 80 controls the gas supply GS to supply the second precursor gas into the chamber 10. In order to perform step ST22, the controller 80 may control the exhaust device 50 to set the pressure in the chamber 10 to a designated pressure. When plasma is generated from the second precursor gas in step ST22, the controller 80 controls the first radio-frequency power supply 62 and/or the second radio-frequency power supply 64 to supply the first radio-frequency power and/or the second radio-frequency power.

Step ST2$b$ is performed after step ST22 is performed. In step ST2$b$, purging of the internal space 10$s$ is performed. That is, the gas in the internal space 10$s$ is discharged. In step ST2$b$, an inert gas such as a rare gas or nitrogen gas may be supplied from the gas supply GS into the chamber 10. When step ST2$b$ is performed, the second organic compound that has been excessively deposited on the substrate W is removed. In order to perform step ST2$b$, the controller 80 controls the exhaust device 50. The controller 80 may further control the gas supply GS to supply the inert gas into the chamber 10. Step ST2$b$ may not be performed.

In an embodiment, the polymerization of the first organic compound and the second organic compound occurs at a temperature of 30° C. or higher and 200° C. or lower. In an embodiment, during step ST2 (steps ST21 and ST22), the substrate W is heated to cause the polymerization of the first organic compound and the second organic compound. Thus, heat is applied to the substrate W from the plurality of heaters HT. In order to heat the substrate W in step ST2, the controller 80 controls the heater controller HC to apply a designated amount of power to each heater HT.

In step ST2, steps ST21 and ST22 may be alternately repeated. In an embodiment, the sequence including steps ST21 and ST22 is performed a predetermined number of times. The film thickness of the organic protective film PF is determined by the predetermined number of times. In step ST2$c$, it is determined whether a stop condition is satisfied. In step ST2$c$, the stop condition is determined to be satisfied, for example, when the number of times of performing the sequence reaches a predetermined number of times. When it is determined in step ST2$c$ that the stop condition is not satisfied, the sequence is performed again. Meanwhile, when it is determined in step ST2$c$ that the stop condition is satisfied, step ST2 is ended. In step ST2, the number of times of performing the sequence may be one. Each sequence in step ST2 may not include at least one of steps ST2$a$ and ST2$b$. In each sequence of step ST2, step ST22 may be performed before step ST21.

Hereinafter, descriptions will be made on the first organic compound, the second organic compound, and the organic compound produced by the polymerization of the first organic compound and the second organic compound, that is, the organic compound that makes up the organic film OF.

The first organic compound may be isocyanate represented by the following formula (1) or (2), and the second organic compound may be amine represented by the following formula (3) or (4). That is, the first organic compound may be monofunctional or difunctional isocyanate, and the second organic compound may be monofunctional or difunctional amine.

OCN—R (1)

OCN—R—NCO (2)

H$_2$N—R—NH$_2$ (4)

In the formulas (1) and (2), R is a saturated hydrocarbon group such as an alkyl group (straight-chain or cyclic alkyl group), an unsaturated hydrocarbon group such as an aryl group, or a group containing heteroatoms such as N, O, S, F, or Si. The group containing heteroatoms includes a saturated hydrocarbon group or an unsaturated hydrocarbon group in which a portion of elements is replaced with N, O, S, F, or Si. As for isocyanate which is the first organic compound, for example, an aliphatic compound or an aromatic compound may be used. As for the aliphatic compound, an aliphatic chain compound or an aliphatic cyclic compound may be used. Examples of the aliphatic compound include hexamethylene diisocyanate. Examples of the aliphatic cyclic compound include 1,3-bis(isocyanatemethyl)cyclohexane (H6XDI).

In the formulas (3) and (4), R is a saturated hydrocarbon group such as an alkyl group (straight-chain or cyclic alkyl group), an unsaturated hydrocarbon group such as an aryl group, or a group containing heteroatoms such as N, O, S, F, or Si. The group containing heteroatoms includes a saturated hydrocarbon group or an unsaturated hydrocarbon group in which a portion of elements is replaced with N, O, S, F, or Si. The atomic group represented by R in the formulas (1) and (2) may be the same as or different from the atomic group represented by R in the formulas (3) and (4). As for amine which is the second organic compound, for example, an aliphatic compound or an aromatic compound may be used. As for the aliphatic compound, an aliphatic chain compound or an aliphatic cyclic compound may be used. Examples of the aliphatic compound include 1,12-diaminododecane (DAD). Examples of the aliphatic cyclic compound include 1,3-bis(aminomethyl)cyclohexane (H6XDA). Here, amine which is the second organic compound may be secondary amine.

Examples of the organic compound obtained from a polymerization (addition condensation) of isocyanate and amine include compounds having urea bonds, which are represented by the following formulas (5) to (8). The compound represented by the formula (5) is produced by a polymerization of the compound represented in the formula (1) and the compound represented by the formula (3). The compound represented by the formula (6) is produced by a polymerization of the compound represented by the formula (1) and the compound represented by the formula (4). Alternatively, the compound represented by the formula (6) is produced by a polymerization of the compound represented by the formula (2) and the compound represented by the formula (3). The compound represented by the formula (7) is produced by a polymerization of the compound represented by the formula (2) and the compound represented by the formula (4). The compound represented by the formula (8) has a structure in which both ends of the polymer represented by the formula (7) are terminated with a monomer having an isocyanate group (e.g., the compound represented by the formula (1)) and a monomer having an amino group (e.g., the compound represented by the formula (3)), respectively. In the formulas (7) and (8), "n" is an integer of 2 or more.

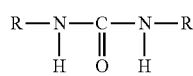 (5)

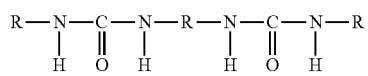 (6)

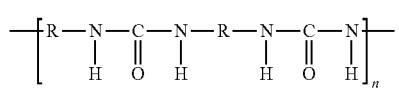 (7)

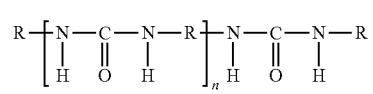 (8)

In another example, the first organic compound may be isocyanate represented by the formula (1) or (2), and the second organic compound may be a compound having a hydroxyl group, which is represented by the following formula (9) or (10). That is, the first organic compound may be monofunctional or difunctional isocyanate, and the second organic compound may be a monofunctional or difunctional compound having a hydroxyl group.

HO—R (9)

HO—R—OH (10)

In the formulas (9) and (10), R is a saturated hydrocarbon group such as an alkyl group (straight-chain or cyclic alkyl group), an unsaturated hydrocarbon group such as an aryl group, or a group containing heteroatoms such as N, O, S, F, or Si. The group containing heteroatoms includes a saturated hydrocarbon group or an unsaturated hydrocarbon group in which a portion of elements is replaced with N, O, S, F, or Si. The atomic group represented by R in the formulas (1) and (2) may be the same as or different from the atomic group represented by R in the formulas (9) and (10). The compound having a hydroxyl group is alcohol or phenol. Examples of alcohol which is the second organic compound include ethylene glycol. Examples of phenol which is the second organic compound include hydroquinone.

Examples of the organic compound obtained from a polymerization (polyaddition) of isocyanate and the compound having a hydroxyl group include compounds having urethane bonds, which are represented by the following formulas (11) to (15). The compound represented by the formula (11) is produced by a polymerization of the compound represented by the formula (1) and the compound represented by the formula (9). The compound represented by the formula (12) is produced by a polymerization of the compound represented by the formula (1) and the compound represented by the formula (10). The compound represented by the formula (13) is produced by a polymerization of the compound represented by the formula (2) and the compound represented by the formula (9). The compound represented by the formula (14) is produced by a polymerization of the compound represented by the formula (2) and the compound represented by the formula (10). The compound represented by the formula (15) has a structure in which both ends of the polymer represented by the formula (14) are terminated with a monomer having an isocyanate group (e.g., the compound represented by the formula (1)) and a monomer having a hydroxyl group (e.g., the compound represented by the formula (9)), respectively. In the formulas (14) and (15), "n" is an integer of 2 or more.

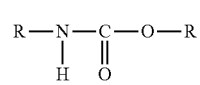 (11)

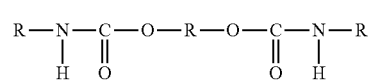 (12)

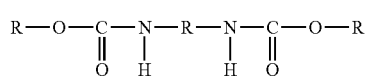 (13)

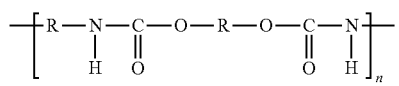 (14)

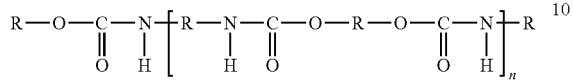 (15)

In yet another example, the first organic compound may be carboxylic acid represented by the following formula (16) or (17), and the second organic compound may be amine represented by the formula (3) or (4). That is, the first organic compound may be monofunctional or difunctional carboxylic acid, and the second organic compound may be monofunctional or difunctional amine.

 (16)

 (17)

In the formulas (16) and (17), R is a saturated hydrocarbon group such as an alkyl group (straight-chain or cyclic alkyl group), an unsaturated hydrocarbon group such as an aryl group, or a group containing heteroatoms such as N, O, S, F, or Si. The group containing heteroatoms includes a saturated hydrocarbon group or an unsaturated hydrocarbon group in which a portion of elements is replaced with N, O, S, F, or Si. The atomic group represented by R in the formulas (3) and (4) may be the same as or different from the atomic group represented by R in the formulas (16) and (17). Examples of carboxylic acid which is the first organic compound include terephthalic acid.

Examples of the organic compound obtained from a polymerization (polycondensation) of carboxylic acid and amine include compounds having amide bonds, which are represented by the following formulas (18) to (22), for example, polyamide. The compound represented by the formula (18) is produced by a polymerization of the compound represented by the formula (16) and the compound represented by the formula (3). The compound represented by the formula (19) is produced by a polymerization of the compound represented by the formula (16) and the compound represented by the formula (4). The compound represented by the formula (20) is produced by a polymerization of the compound represented by the formula (17) and the compound represented by the formula (3). The compound represented by the formula (21) is produced by a polymerization of the compound represented by the formula (17) and the compound represented by the formula (4). The compound represented by the formula (22) has a structure in which both ends of the polymer represented by the formula (21) are terminated with a monomer having a carboxyl group (e.g., the compound represented by the formula (16)) and a monomer having an amino group (e.g., the compound represented by the formula (3)), respectively. In the formulas (21) and (22), "n" is an integer of 2 or more. Water molecules are also produced in the polymerization reaction between carboxylic acid and amine. The produced water molecules are exhausted from the processing space under a depressurized environment. Accordingly, the polymerization reaction between carboxylic acid and amine is irreversible.

 (18)

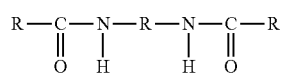 (19)

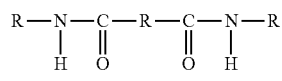 (20)

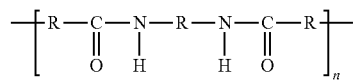 (21)

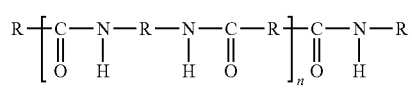 (22)

The first organic compound used for the polymerization with amine represented by the formula (3) or (4) may be carboxylic acid halide represented by the following formula (23). In the formula (23), X is F, Cl, Br, or I. The atomic group represented by R in the formula (23) may be the same as the atomic group represented by R in the formulas (16) and (17).

 (23)

In yet another example, the first organic compound may be carboxylic acid represented in the formula (16) or (17), and the second organic compound may be the compound having a hydroxyl group, which is represented by the formula (9) or (10). That is, the first organic compound may be monofunctional or difunctional carboxylic acid, and the second organic compound may be a monofunctional or difunctional compound having a hydroxyl group. The atomic group represented by R in the formulas (16) and (17) may be the same as or different from the atomic group represented by R in the formulas (9) and (10).

Examples of the organic compound obtained from a polymerization (polycondensation) of carboxylic acid and the compound having a hydroxyl group include compounds having ester bonds, which are represented by the following formulas (24) to (28), for example, polyester. The compound represented by the formula (24) is produced by a polymerization of the compound represented by the formula (16) and the compound represented by the formula (9). The compound represented by the formula (25) is produced by a polymerization of the compound represented by the formula (16) and the compound represented by the formula (10). The compound represented by the formula (26) is produced by a polymerization of the compound represented by the formula (17) and the compound represented by the formula (9). The compound represented by the formula (27) is produced by a polymerization of the compound represented by the formula (17) and the compound represented by the formula (10). The compound represented by the formula (28) has a structure in which both ends of the polymer represented by the formula (27) are terminated with a monomer having a carboxyl group (e.g., the compound represented by the formula (16)) and a monomer having a hydroxyl group (e.g., the compound represented by the formula (9)), respectively. In the formulas (27) and (28), "n" is an integer of 2 or more. Water molecules are also produced in the polymerization reaction between carboxylic acid and the compound having a hydroxyl group. The produced water molecules are exhausted from the processing space under a depressurized environment. Accordingly, the polymerization reaction between carboxylic acid and the compound having a hydroxyl group is irreversible.

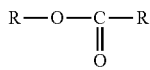 (24)

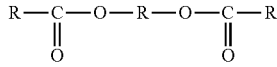 (25)

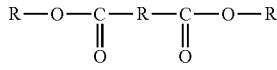 (26)

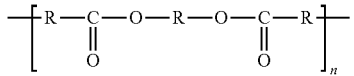 (27)

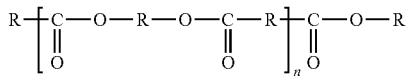 (28)

The first organic compound used for the polymerization with the compound having a hydroxyl group, which is represented by the formula (9) or (10), may be carboxylic acid halide represented by the formula (23).

In yet another example, the first organic compound may be carboxylic anhydride represented by the following formula (29) or (30), and the second organic compound may be amine represented by the formula (3) or (4).

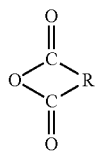 (29)

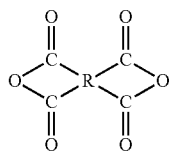 (30)

In the formulas (29) and (30), R is a saturated hydrocarbon group such as an alkyl group (straight-chain or cyclic alkyl group), an unsaturated hydrocarbon group such as an aryl group, or a group containing heteroatoms such as N, O, S, F, or Si. The group containing heteroatoms includes a saturated hydrocarbon group or an unsaturated hydrocarbon group in which a portion of elements is replaced with N, O, S, F, or Si. The atomic group represented by R in the formulas (29) and (30) may be the same as or different from the atomic group represented by R in the formulas (3) and (4). Examples of carboxylic anhydride which is the first organic compound include pyromellitic anhydride.

Examples of the organic compound obtained from a polymerization of carboxylic anhydride and amine include an imide compound represented by the following formula (31) or (32). The compound represented by the formula (31) is produced by a polymerization of the compound represented by the formula (29) and the compound represented by the formula (3). The compound represented by the formula (32) is produced by a polymerization of the compound represented by the formula (30) and the compound represented by the formula (4). In the formula (32), "n" is an integer of 2 or more. Water molecules are also produced in the polymerization reaction of carboxylic anhydride and amine. The produced water molecules are exhausted from the processing space under a depressurized environment. Accordingly, the polymerization reaction of carboxylic anhydride and amine is irreversible. For the polymerization of carboxylic anhydride and amine, monofunctional carboxylic anhydride, bifunctional carboxylic anhydride, monofunctional amine, and difunctional amine may be used.

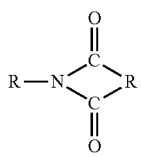 (31)

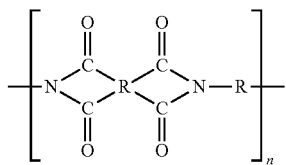 (32)

In yet another example, the first organic compound may be bisphenol A, and the second organic compound may be diphenyl carbonate. In yet another example, the first organic compound may be bisphenol A, and the second organic compound may be epichlorohydrin.

Figure 10:
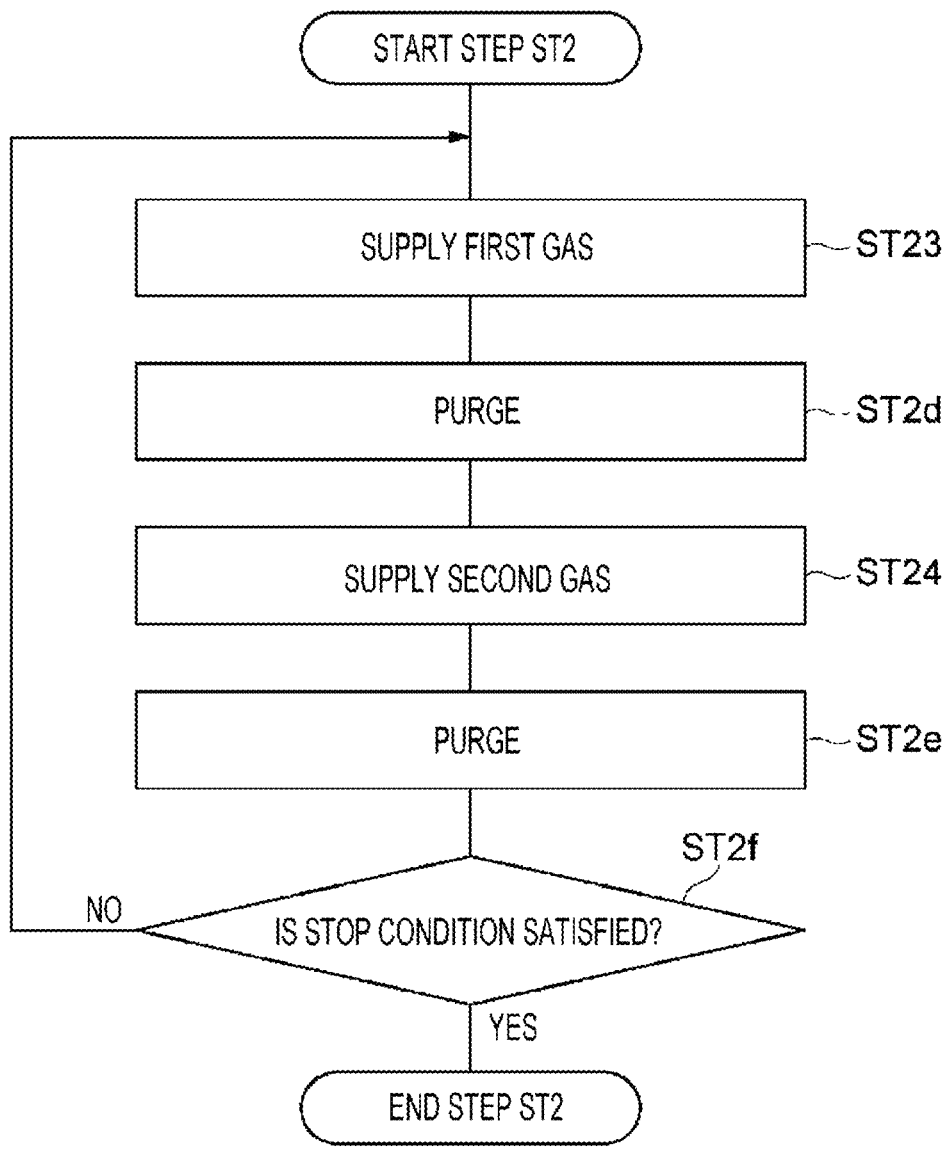
FIG. 10 is a flowchart of another example of step ST2 of the etching method illustrated in FIG. 1.

FIG. 10 is a flowchart illustrating another example of step ST2 of the etching method illustrated in FIG. 1. Step ST2 illustrated in FIG. 10 may be used as step ST2 in the method MT. Step ST2 illustrated in FIG. 10 includes steps ST23 and ST24. Step ST2 illustrated in FIG. 10 may further include steps ST2*d* and ST2*e*.

In step ST23, a first gas is supplied as a precursor gas to the substrate W. The first gas used in step ST23 contains an organic compound (hereinafter, referred to as a "precursor organic compound"). In step ST23, the precursor organic compound is adsorbed onto the surface of the substrate W. In step ST23, the first gas may be supplied to the substrate W without generating plasma then. Alternatively, in step ST23, plasma may be generated from the first gas, and chemical species in the plasma may be adsorbed as the precursor organic compound onto the surface of the substrate W. In order to perform step ST23, the controller 80 controls the gas supply GS to supply the first gas into the chamber 10. In order to perform step ST23, the controller 80 may control the exhaust device 50 to set the pressure in the chamber 10 to a designated pressure. When plasma is generated from the first gas in step ST23, the controller 80 controls the first radio-frequency power supply 62 and/or the second radio-frequency power supply 64 to supply the first radio-frequency power and/or the second radio-frequency power.

Step ST2*d* is performed between steps ST23 and ST24. Step ST2*d* is the same as step ST2*a*. When step ST2*d* is performed, the precursor organic compound that has been excessively deposited on the substrate W is removed. Step ST2*b* may not be performed.

In step ST2, a second gas is supplied to the substrate W in order to form the organic compound that makes up the organic protective film PF from the precursor organic compound on the substrate W. The second gas is selected according to the first gas used in step ST23. In step ST24, the second gas may be supplied to the substrate W without generating plasma then. Alternatively, in step ST24, plasma may be generated from the second gas, and chemical species in the plasma may be supplied to the substrate W. That is, in step ST24, a plasma processing may be performed. When plasma is generated in step ST24, energy is given to at least one of the precursor organic compound and the second gas on the substrate W. For example, in step ST24, the second gas is excited by the energy, and plasma is generated from the second gas. Then, the precursor organic compound on the substrate W reacts with chemical species from the plasma, and the organic compound that makes up the organic protective film PF is formed on the substrate W.

In order to perform step ST24, the controller 80 controls the gas supply GS to supply the second gas into the chamber 10. In order to perform step ST24, the controller 80 controls the exhaust device 50 to set the pressure in the chamber 10 to a designated pressure. When plasma is generated from the second gas in step ST24, the controller 80 controls the first radio-frequency power supply 62 and/or the second radio-frequency power supply 64 to supply the first radio-frequency power and/or the second radio-frequency power.

Step ST2*e* is performed after step ST24 is performed. In step ST2*e*, purging of the internal space 10*s* is performed. That is, the gas in the internal space 10*s* is discharged. Step ST2*e* is the same as step ST2*b*. Step ST2*e* may not be performed.

In step ST2, steps ST23 and ST24 may be alternately repeated. In an embodiment, the sequence including steps ST23 and ST24 is performed a predetermined number of times. The film thickness of the organic protective film PF is determined by the predetermined number of times. In step ST2*f*, it is determined whether the stop condition is satisfied. In step ST2*f*, the stop condition is determined to be satisfied, for example, when the number of times of performing the sequence reaches a predetermined number of times. When it is determined in step ST2*f* that the stop condition is not satisfied, the sequence is performed again. Meanwhile, when it is determined in step ST2*f* that the stop condition is satisfied, step ST2 is ended. The number of times of performing the sequence in step ST2 may be one. Each sequence in step ST2 may not include at least one of steps ST2*d* and ST2*e*.

Hereinafter, descriptions will be made on the precursor organic compound used in step ST23, the second gas used in step ST24, and the organic compound produced in step ST24, that is, the organic compound that makes up the organic protective film PF.

The precursor organic compound includes at least one organic compound selected from the group consisting of isocyanate, carboxylic acid, carboxylic acid halide, carboxylic anhydride, and epoxide.

The second gas used in step ST24 includes at least one selected from the group consisting of a gas of a compound having an NH group, a gas of a compound having a hydroxyl group, a mixed gas of $N_2$ and $H_2$, Ar gas, $H_2O$ gas, and a mixed gas of $H_2$ and $O_2$. Examples of the compound having an NH group include amine, $NH_3$, $N_2H_2$, and $N_2H_4$.

The precursor organic compound may include at least one selected from the group consisting of isocyanate, carboxylic acid, and carboxylic acid halide. In this case, the second gas used in step ST24 includes at least one selected from the group consisting of a gas of a compound having an NH group, a gas of a compound having a hydroxyl group, a mixed gas of $N_2$ and $H_2$, Ar gas, $H_2O$ gas, and a mixed gas of $H_2$ and $O_2$.

When the precursor organic compound is carboxylic anhydride or epoxide, the second gas used in step ST24 includes at least one selected from the group consisting of a compound gas having an NH group, a mixed gas of $N_2$ and $H_2$, and Ar gas.

The precursor organic compound may be isocyanate represented by the formula (1) or (2). In this case, the second gas used in step ST24 may be any one gas among a gas of a compound having an NH group, a gas of a compound having a hydroxyl group, a mixed gas of $N_2$ and $H_2$, $H_2O$ gas, a mixed gas of $H_2$ and $O_2$, and Ar gas.

The organic compound produced by a reaction between isocyanate and the second gas (a gas of a compound having an NH group or a mixed gas of $N_2$ and $H_2$) or a reaction with chemical species from plasma generated therefrom may be a polymeric compound having an urea bond. The polymeric compound having an urea bond is, for example, a compound represented by the following formula (33). The compound represented by the formula (33) may be produced by a reaction similar to a plasma polymerization. In the formula (33), "n" is an integer of 2 or more.

(33)

The organic compound produced by a reaction between isocyanate and the second gas (a gas of a compound having an NH group, $H_2O$ gas, or a mixed gas of $H_2$ and $O_2$) or a reaction with chemical species from plasma generated therefrom may be a polymeric compound having urethane bonds. The polymeric compound having urethane bonds is, for example, a compound represented by the following formula (34) (e.g., polyurethane). The compound represented by the formula (34) may be produced by a reaction similar to a plasma polymerization. In the formula (34), "n" is an integer of 2 or more.

(34)

The organic compound may also be produced by a reaction between isocyanate and chemical species from plasma generated from Ar gas.

The precursor organic compound may be, for example, carboxylic acid or carboxylic acid halide represented by the formula (16) or (17). In the formulas (16) and (17), H may be replaced with a halogen atom. In this case, the second gas used in step ST24 may be any one gas among a gas of a compound having an NH group, a gas of a compound having a hydroxyl group, a mixed gas of $N_2$ and $H_2$, $H_2O$ gas, a mixed gas of $H_2$ and $O_2$, and Ar gas.

The organic compound that may be produced by the reaction between carboxylic acid or carboxylic acid halide and the second gas (a gas of a compound having an NH group or a mixed gas of $N_2$ and $H_2$) or a reaction with chemical species from plasma generated therefrom may be a polymeric compound having an amide bond. The polymeric compound having an amide bond is, for example, a compound represented by the following formula (35) (e.g., polyamide). In the formula (35), "n" is an integer of 2 or more.

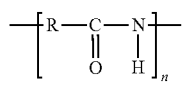
(35)

The organic compound that may be produced by the reaction between carboxylic acid or carboxylic acid halide and the second gas (a gas of a compound having a hydroxyl group, $H_2O$ gas or a mixed gas of $H_2$ and $O_2$) or a reaction with chemical species from plasma generated therefrom may be a polymeric compound having an ester bond. The polymeric compound having an ester bond is, for example, a compound represented by the following formula (36) (e.g., polyester). In the formula (36), "n" is an integer of 2 or more.

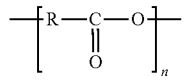
(36)

The organic compound may also be produced by a reaction between carboxylic acid or carboxylic acid halide and chemical species from plasma generated from Ar gas.

The precursor organic compound may be, for example, carboxylic anhydride represented by the formula (29) or (30). In this case, the second gas used in step ST24 may be any one gas among a gas of a compound having an NH group, a gas of a compound having a hydroxyl group, a mixed gas of $N_2$ and $H_2$, and Ar gas.

The organic compound that may be produced by the reaction between carboxylic anhydride and the second gas (a gas of a compound having an NH group or a mixed gas of $N_2$ and $H_2$) or a reaction with chemical species from plasma generated therefrom may be a polymeric compound having an imide bond. The polymeric compound having an imide bond is, for example, the compound represented by the formula (32).

The organic compound may also be produced by a reaction between carboxylic anhydride and chemical species from plasma generated from Ar gas.

The precursor organic compound may be, for example, epoxide represented by the following formula (37). The second gas that may be used when the organic compound is, for example, epoxide represented by the formula (37) is any one gas among a gas of a compound having an NH group, $NH_3$ gas, a mixed gas of $N_2$ and $H_2$, and an Ar gas.

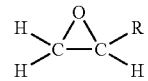
(37)

In the formula (37), R is a saturated hydrocarbon group such as an alkyl group (straight-chain or cyclic alkyl group), an unsaturated hydrocarbon group such as an aryl group, or a group containing heteroatoms such as N, O, S, F, or Si. The group containing heteroatoms includes a saturated hydrocarbon group or an unsaturated hydrocarbon group in which a portion of elements is replaced with N, O, S, F, or Si.

The organic compound that may be produced by the reaction between epoxide and the second gas (a gas of a compound having an NH group, $NH_3$ gas or a mixed gas of $N_2$ and $H_2$) or a reaction with chemical species from plasma generated therefrom may be epoxy. Here, epoxy may be, for example, a polymeric compound represented by the following formula (38). In the formula (38), "n" is an integer of 2 or more.

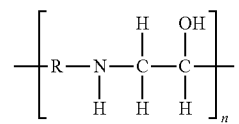
(38)

The organic compound may also be produced by a reaction between epoxide and chemical species from plasma generated from Ar gas.

In an embodiment, the organic protective film PF may not be conformally formed on the surface of the substrate W. For example, the organic protective film PF may not be formed on the bottom of the recess RP. When the organic protective film PF is not formed on the bottom of the recess RP, the condition of step ST2 is controlled such that the reaction for producing the organic compound that makes up the organic protective film PF occurs on the side wall surface defining the recess RP and is suppressed at the bottom of the recess RP. In an example, in order not to form the organic protective film PF on the bottom of the recess RP or suppress the formation of the organic protective film PF on the bottom of the recess RP, the processing time length of step S21 and/or the processing time length of step S22 which are illustrated in FIG. 9 are adjusted. Alternatively, in order not to form the organic protective film PF on the bottom of the recess RP or suppress the formation of the organic protective film PF on the bottom of the recess RP, the processing time length of step S23 and/or the processing time length of step S24 which are illustrated in FIG. 10 are adjusted.

Referring back to FIG. 1, in step ST3 subsequent to step ST2, an additional plasma etching is performed on the organic film OF. Step ST3 is the same as step ST1. As a result of the performance of step ST3, the depth of the recess formed in the organic film OF becomes relatively deeper as illustrated in FIG. 6A.

Steps ST2 and ST3 may be alternately repeated. In an embodiment, the sequence including steps ST2 and ST3 is performed a predetermined number of times. In step STJ1, it is determined whether the stop condition is satisfied. In step STJ1, the stop condition is determined to be satisfied, for example, when the number of times of performing the sequence reaches a predetermined number of times. When it is determined in step STJ1 that the stop condition is not satisfied, the sequence is performed again. Meanwhile, when it is determined in step STJ1 that the stop condition is satisfied, the sequence is ended. In the method MT, the organic film OF is etched until the surface of the film EF is exposed as illustrated in FIG. 6B. Each of steps ST2 and ST3 may be performed only once.

When steps ST2 and ST3 are alternately repeated, step STR may be performed after step ST3 is performed and before step ST2 is performed. In step STR, the organic protective film PF is removed. In step STR, the organic protective film PF is removed by chemical species from plasma of the processing gas. The processing gas used in step STR may be the same as the processing gas used in step ST1. As a result of the performance of step STR, the recess RP is suppressed from being clogged by the organic protective film PF.

In order to perform step STR, the controller 80 controls the gas supply GS to supply the processing gas into the chamber 10. In order to perform step STR, the controller 80 controls the exhaust device 50 to set the pressure in the chamber 10 to a designated pressure. In order to perform step STR, the controller 80 controls the first radio-frequency power supply 62 and/or the second radio-frequency power supply 64 to supply the first radio-frequency power and/or the second radio-frequency power.

In an embodiment, then, step ST4 is performed. In step ST4, a plasma etching is performed on the film EF. In step ST4, a processing gas is supplied into the chamber 10. The processing gas used in step ST4 includes an etchant for the film EF. The processing gas used in step ST4 contains fluorocarbon gas when the film EF is a silicon oxide film. The processing gas used in step ST4 may contain one or more gases such as a rare gas such as Ar gas and oxygen gas, in addition to fluorocarbon gas. In step ST4, the first radio-frequency power and/or the second radio-frequency power are supplied, and plasma is generated from the processing gas in the chamber 10. The film EF is etched by chemical species from the generated plasma. As illustrated in FIG. 7A, the recess RP is formed to be continuous in the organic film OF and the film EF by the plasma etching in step ST4.

In order to perform step ST4, the controller 80 controls the gas supply GS to supply the processing gas into the chamber 10. In order to perform step ST4, the controller 80 controls the exhaust device 50 to set the pressure in the chamber 10 to a designated pressure. In order to perform step ST4, the controller 80 controls the first radio-frequency power supply 62 and/or the second radio-frequency power supply 64 to supply the first radio-frequency power and/or the second radio-frequency power.

In an embodiment, steps ST4 and ST5 may be alternately repeated. In this case, in step STJ2 performed after step ST4, it is determined whether the stop condition is satisfied. In step STJ2, the stop condition is determined to be satisfied when the number of times of performing step ST4 reaches a predetermined number of times. When it is determined in step STJ2 that the stop condition is not satisfied, step ST5 is performed, and then, step ST4 is performed again. In step ST5, as illustrated in FIG. 7B, the organic protective film PF is further formed on the side wall surface of the organic film OF and the side wall surface of the film EF that define the recess RP. Step ST5 is the same as step ST2. Meanwhile, when it is determined in step STJ2 that the stop condition is satisfied, the plasma etching of the film EF is ended. In an embodiment, the film EF is etched until the underlying region UR is exposed as illustrated in FIG. 8A. Here, step ST4 may be performed only once until the underlying region UR is exposed.

In an embodiment, then, step ST6 is performed. In step ST6, an ashing process is performed on the organic film OF. In step ST6, a processing gas is supplied into the chamber 10. The processing gas used in step ST6 may be an oxygen-containing gas. The oxygen-containing gas is, for example, oxygen gas. Alternatively, the processing gas used in step ST6 may be a mixed gas containing nitrogen gas and hydrogen gas. In step ST6, the first radio-frequency power and/or the second radio-frequency power are supplied, and plasma is generated from the processing gas in the chamber 10. The organic film OF is etched and removed by chemical species from the generated plasma. In step ST6, the organic protective film PF is removed together with the organic film OF as illustrated in FIG. 8B.

In order to perform step ST6, the controller 80 controls the gas supply GS to supply the processing gas into the chamber 10. In order to perform step ST6, the controller 80 controls the exhaust device 50 to set the pressure in the chamber 10 to a designated pressure. In order to perform step ST6, the controller 80 controls the first radio-frequency power supply 62 and/or the second radio-frequency power supply 64 to supply the first radio-frequency power and/or the second radio-frequency power.

The organic film OF and the organic protective film PF are formed of an organic material. Thus, the organic protective film PF may be easily removed together with the organic film OF. The organic protective film PF is formed on the side wall surface of the organic film OF in step ST2 after the recess RP is formed in the organic film OF in step ST1. The organic film OF is further etched in step ST3 in a state where the side wall surface of the organic film OF is protected by the organic protective film PF. Thus, it is possible to suppress the occurrence of bowing caused from the plasma etching of the organic film OF with the protective film that is easily removed together with the organic film OF.

As described above, in an embodiment, step ST2 may be started when the aspect ratio of the recess RP is 5 or lower. According to an embodiment, the occurrence of bowing in the organic film OF is more effectively suppressed.

Figure 11:
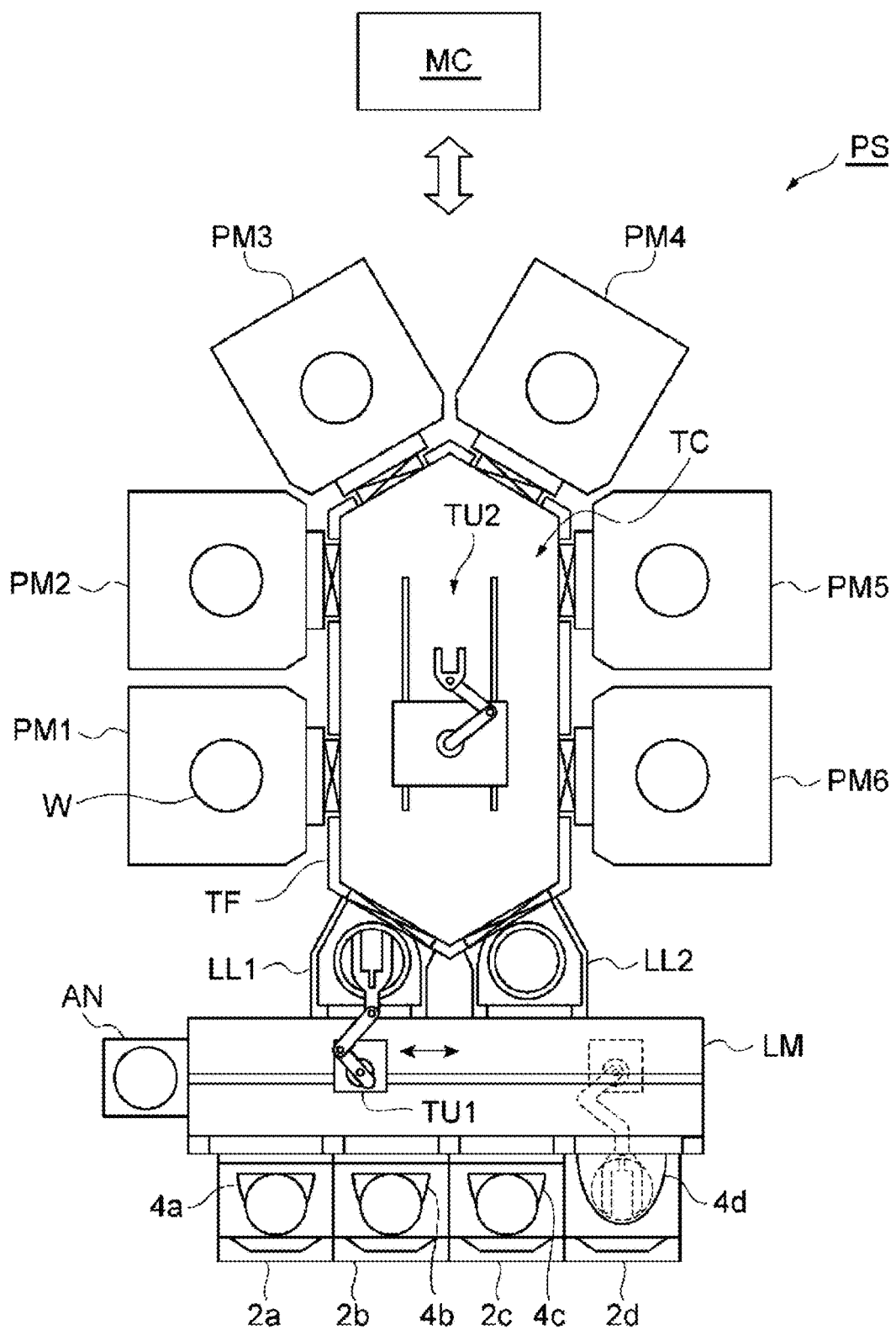
FIG. 11 is a view schematically illustrating a substrate processing system according to an embodiment.

In another embodiment, the method MT may be performed using a substrate processing system that includes a plurality of processing modules, rather than a single plasma processing apparatus which is a single processing module. FIG. 11 is a view schematically illustrating a substrate processing system according to an embodiment.

The substrate processing system illustrated in FIG. 11 (hereinafter, referred to as the "system PS") includes process modules PM1 to PM6, a transfer module TF, and a controller MC. The system PS may further include tables 2a to 2d, containers 4a to 4d, a loader module LM, an aligner AN, and load lock modules LL1 and LL2. Each of the number of tables, the number of containers, and the number of load lock modules in the system PS may be arbitrary. The number of process modules may be two or more.

The tables 2a to 2d are arranged along one edge of the loader module LM. The containers 4a to 4d are mounted on the tables 2a to 2d, respectively. Each of the containers 4a to 4d is a container called, for example, FOUP (front opening unified pod). Each of the containers 4a to 4d is configured to accommodate the substrate W therein.

The loader module LM includes a chamber. The pressure in the chamber of the loader module LM is set to the atmospheric pressure. A transfer device TU1 is provided in the chamber of the loader module LM. The transfer device TU1 is, for example, an articulated robot and is controlled by the controller MC. The transfer device TU1 is configured to transfer the substrate W between each of the containers 4a to 4d and the aligner AN, between the aligner AN and each of the load lock modules LL1 and LL2, and between each of the load lock modules LL1 and LL2 and each of the containers 4a to 4d. The aligner AN is connected to the loader module LM. The aligner AN is configured to adjust the position of the substrate W (position calibration).

Each of the load lock modules LL1 and LL2 is provided between the loader module LM and the transfer module TF. Each of the load lock modules LL1 and LL2 provides a preliminary depressurization chamber.

The transfer module TF is connected to each of the load lock modules LL1 and LL2 via a gate valve. The transfer module TF includes a chamber that provides a depressurizable space TC. The transfer module TF is configured to transfer the substrate W to each of the plurality of process modules PM1 to PM6 through the depressurized space TC. The transfer module TF further includes a transfer device TU2. The transfer device TU2 is provided in the space TC. The transfer device TU2 is, for example, an articulated robot and is controlled by the controller MC. The transfer unit TU2 is configured to transfer the substrate W between each of the load lock modules LL1 and LL2 and each of the process modules PM1 to PM6 and between any two process modules of the process modules PM1 to PM6.

Each of the process modules PM1 to PM6 is a processing apparatus configured to perform a dedicated substrate processing. The system PS includes one or more plasma processing apparatuses and a film forming apparatus as the process modules PM1 to PM6.

The one or more plasma processing apparatuses of the system PS are used to perform steps ST1, ST3, ST4, ST6, and STR. Steps ST1, ST3, ST4, ST6, and STR may be performed using one plasma processing apparatus. At least one of steps ST1, ST3, ST4, ST6, and STR may be performed using a plasma processing apparatus which is different from a plasma processing apparatus used in another step of steps ST1, ST3, ST4, ST6, and STR.

Each of the one or more plasma processing apparatuses of the system PS may be the plasma processing apparatus 1. Each of the one or more plasma processing apparatuses of the system PS may be a capacitively coupled plasma processing apparatus which is different from the plasma processing apparatus 1. Each of the one or more plasma processing apparatuses of the system PS may be another type of plasma processing apparatus such as an inductively coupled plasma processing apparatus or a plasma processing apparatus that generates plasma from a gas by surface waves such as microwaves. However, similarly to the plasma processing apparatus 1, each of the one or more plasma processing apparatuses of the system PS includes one or more energy sources such as a chamber, a substrate support, a gas supply, and a radio-frequency power supply.

The film forming apparatus of the system PS is a plasma processing apparatus when plasma is generated in step ST2. The plasma processing apparatus which is the film forming apparatus of the system PS may be the plasma processing apparatus 1. The plasma processing apparatus which is the film forming apparatus of the system PS may be another type of plasma processing apparatus such as an inductively coupled plasma processing apparatus or a plasma processing apparatus that generates plasma from a gas by surface waves such as microwaves. However, similarly to the plasma processing apparatus 1, the plasma processing apparatus which is the film forming apparatus of the system PS includes one or more energy sources such as a chamber, a substrate support, a gas supply, and a radio-frequency power supply.

When plasma is not generated in step ST2, the film forming apparatus of the system PS may be a film forming apparatus that includes a chamber, a substrate support capable of heating the substrate W similarly to the substrate support of the plasma processing apparatus 1, and a gas supply, and does not include a plasma source.

The controller MC is configured to control each unit of the system PS, for example, the transfer module TF and the process modules PM1 to PM6. The controller MC may be a computer that includes a processor, a storage unit such as a memory, an input device, a display device, a signal input/output interface and others. The storage unit of the controller MC stores a control program and recipe data. The processor of the controller MC executes the control program. When the processor of the controller MC executes the control program to control each unit of the system PS according to recipe data, the method MT is performed in the system PS.

Specifically, the controller MC controls the transfer module TF to transfer the substrate W to a first process module (e.g., a plasma processing apparatus) to be used for performing step ST1, among the process modules PM1 to PM6. The transfer module TF may transfer the substrate W to the first process module only through the depressurized space TC.

Then, the controller MC controls the first process module. Specifically, similarly to step ST1 performed in the plasma processing apparatus 1, the controller MC controls each unit of the first process module to generate plasma of the processing gas.

Then, the controller MC controls the transfer module TF to transfer the substrate W to a second process module (e.g., a film forming apparatus) to be used for performing step ST2, among the process modules PM1 to PM6. The substrate W may be transferred from the first process module to the second process module only through the depressurized space TC.

Then, the controller MC controls the second process module to form the organic protective film PF in step ST2. Specifically, the controller MC controls each unit of the second process module to perform step ST2 described above.

Then, the controller MC controls the transfer module TF to transfer the substrate W to a third process module (e.g., a plasma processing apparatus) to be used for performing step ST3, among the process modules PM1 to PM6. The substrate W may be transferred from the second process module to the third process module only through the depressurized space TC. The first process module may be used as the third process module. The third process module may be a process module different from the first process module.

Then, the controller MC controls the third process module to perform the additional plasma etching on the organic protective film PF in step ST3. Specifically, as in step ST3 performed in the plasma processing apparatus 1, the controller MC controls each unit of the third process module to generate plasma of the processing gas.

In step ST4 subsequent to step ST3, a fourth process module (e.g., a plasma processing apparatus) among the process modules PM1 to PM6 is used. The third process module may be used as the fourth process module. The fourth process module may be a process module different from the third process module. When the fourth process module is a process module different from the third process module, the controller MC controls the transfer module TF to transfer the substrate W to the fourth process module after step ST3 is performed. The substrate W may be transferred from the third process module to the fourth process module only through the depressurized space TC.

The controller MC controls the fourth process module to perform the plasma etching on the film EF in step ST4. Specifically, as in step ST4 performed in the plasma processing apparatus 1, the controller MC controls each unit of the fourth process module to generate plasma of the processing gas.

In an embodiment, the controller MC controls the transfer module TF to transfer the substrate W to a fifth process module (e.g., a film forming apparatus) to be used for performing step ST5, among the process modules PM1 to PM6. The substrate W may be transferred from the fourth process module to the fifth process module only through the depressurized space TC. The second process module may be used as the fifth process module. The fifth process module may be a process module different from the second process module.

In an embodiment, the controller MC controls the fifth process module to form the organic protective film PF in step ST5. Specifically, the controller MC controls each unit of the fifth process module to perform step ST5 described above.

In an embodiment, then, the controller MC controls the transfer module TF to transfer the substrate W to the fourth process module. Then, for performing step ST4 again, the controller MC controls each unit of the fourth process module to generate plasma of the processing gas as in step ST4 performed in the plasma processing apparatus 1.

In an embodiment, in step ST6 subsequent to step ST4, a sixth process module (e.g., a plasma processing apparatus) among the process modules PM1 to PM6 is used. The fourth process module may be used as the sixth process module. The sixth process module may be a process module different from the fourth process module. When the sixth process module is a process module different from the fourth process module, the controller MC controls the transfer module TF to transfer the substrate W to the sixth process module before step ST3 is performed. The substrate W may be transferred from the fourth process module to the sixth process module only through the depressurized space TC.

In an embodiment, the controller MC controls each unit of the sixth process module to perform the ashing process in step ST6. Specifically, as in step ST6 performed in the plasma processing apparatus 1, the controller MC controls each unit of the sixth process module to generate plasma of the processing gas.

While various embodiments have been described, the present disclosure is not limited to the embodiments, and various omissions, replacements, and changes may be made. The elements in different embodiments may be combined with each other to form another embodiment.

For example, the plasma processing apparatuses used for performing the method MT may be a capacitively coupled plasma processing apparatus which is different from the plasma processing apparatus 1. The plasma processing apparatus used for performing the method MT may be another type of plasma processing apparatus such as an inductively coupled plasma processing apparatus or a plasma processing apparatus that generates plasma from a gas by surface waves such as microwaves. However, when the different or another type of plasma processing apparatus is used for forming the organic protective film PF, the plasma processing apparatus includes a substrate support capable of heating the substrate W, similarly to the substrate support of the plasma processing apparatus 1.

Hereinafter, experiments conducted for evaluating the method MT will be described. The experiments described below do not limit the present disclosure.

First, similarly to the substrate W illustrated in FIG. 5A, a plurality of sample substrates each having the recess RP formed by partially etching the organic film OF were prepared. In the sample substrates, the film EF was a silicon oxide film, the organic film OF was an amorphous carbon film, and the mask MK was a SiON film. The thickness of the organic film OF was 3 μm. The depth of the recess RP formed in the organic film OF was about 1 μm. Then, step ST2 was performed on each of the sample substrates. In step ST2 performed on each of the plurality of sample substrates, the sequence was performed a different number of times. The conditions of steps ST21 and ST22 in each sequence of step ST2 are described below.

Figure 12A:
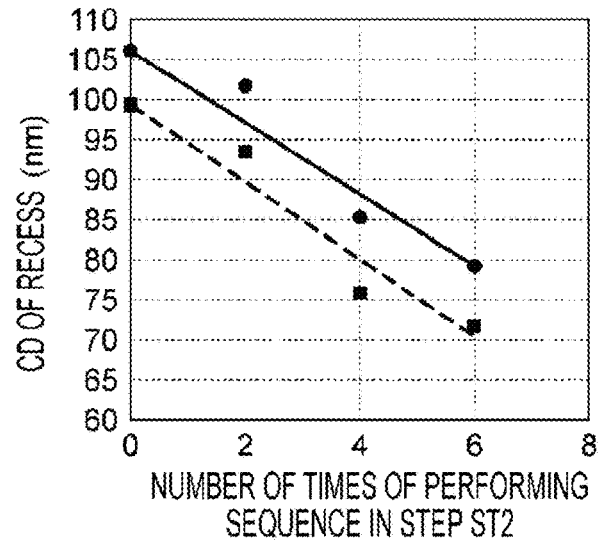
FIGS. 12A to 12C are views illustrating an experimental result.
Figure 12B:
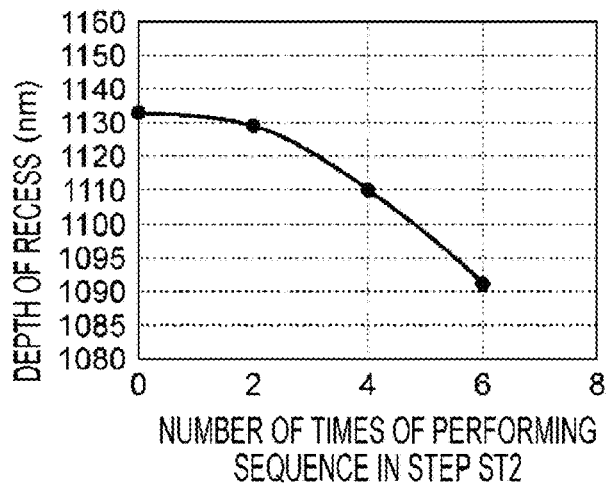
Figure 12C:
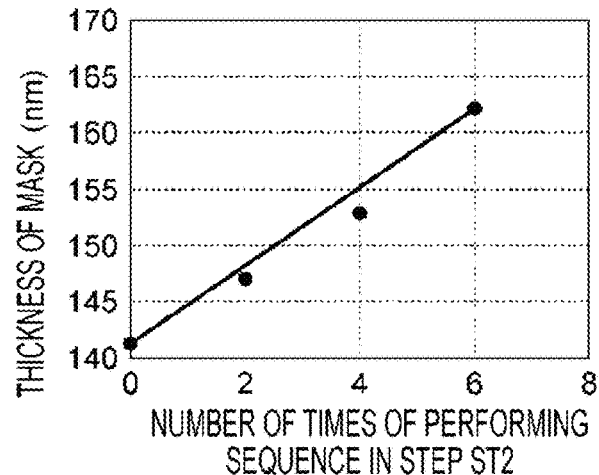

<Conditions of Step ST21>
First precursor gas: Mixed gas of toluene diisocyanate gas and Ar gas
Temperature of substrate W: 80° C.
Processing time length: 30 seconds
<Conditions of Step ST22>
Second precursor gas: Mixed gas of cyclohexanediamine gas and Ar gas
Temperature of substrate W: 80
Processing time length: 30 seconds FIGS. 12A to 12C illustrate the experimental results. In the graph of each of FIGS. 12A to 12C, the horizontal axis represents the number of times of performing the sequence in step ST2 of the experiment. In the graph of FIG. 12A, the vertical axis represents a CD (width) of the recess RP after step ST2 of the experiment is performed. The square plot in FIG. 12A represents the width of the recess RP at the boundary between the organic film OF and the mask MK after step ST2 of the experiment is performed. The circular plot in FIG. 12A represents the maximum width of the recess RP after step ST2 of the experiment is performed. In the graph of FIG. 12B, the vertical axis represents the depth of the recess RP after step ST2 of the experiment is performed. In the graph of FIG. 12C, the vertical axis represents the thickness of the mask MK after step ST2 of the experiment is performed. When the organic protective film PF is formed on the mask MK, the thickness of the mask MK is the sum of the thickness of the mask MK and the thickness of the organic protective film PF.

As a result of the experiment, it is confirmed that the organic protective film PF is conformally formed on the organic film OF by step ST2. Further, as a result of the experiment, as illustrated in FIGS. 12A and 12B, it is confirmed that the CD (width) of the recess RP and the depth of the recess RP decrease as the number of times of performing the sequence in step ST2 increases. Further, as a result of the experiment, as illustrated in FIG. 12C, it is confirmed that the thickness of the mask MK increases as the number of times of performing the sequence in step ST2 increases.

Subsequently, step ST3 was performed on the plurality of sample substrates that had been subjected to step ST2 of the experiment, so as to etch the organic film OF. The etching of the organic film OF was performed until the thickness of the organic film OF below the recess RP becomes about 100 nm. In step ST3 of the experiment, a mixed gas of $O_2$ gas and COS gas was used as the processing gas.

Figure 13:
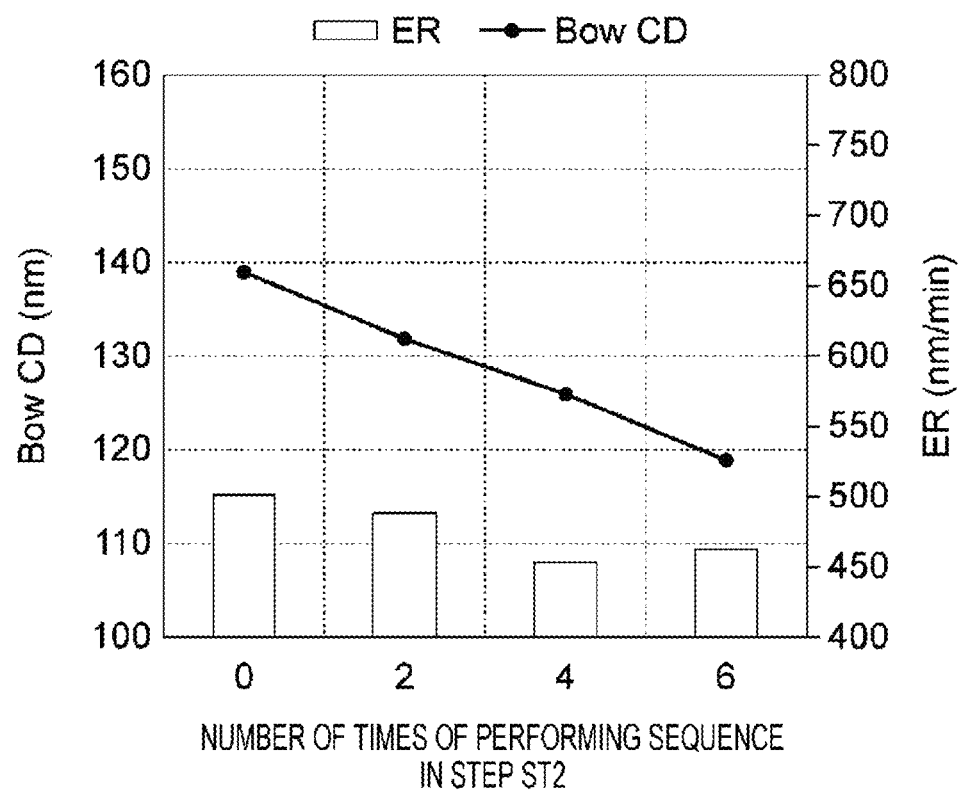
FIG. 13 is a view illustrating an experimental result.

FIG. 13 illustrates the experimental result. In the graph of FIG. 13, the horizontal axis represents the number of times of performing the sequence in step ST2 of the experiment. In FIG. 13, Bow CD represents the maximum width of the recess RP after step ST3 is performed. In FIG. 13, ER represents the etching rate of the organic film OF. As illustrated in FIG. 13, it is confirmed that the occurrence of bowing caused from the plasma etching of the organic film OF is suppressed by performing step ST3 after step ST2 is performed. Further, it is confirmed that the amount of bowing caused from the plasma etching of the organic film OF is reduced with the increase in the number of times of performing the sequence in step ST2. Further, it is confirmed that the etching rate of the organic film OF in step ST3 does not substantially depend on the number of times of performing the sequence in step ST2.

Subsequently, step ST3 was further performed, so as to etch the organic film OF until the film EF of each of the plurality of sample substrates was exposed. As a result of the experiment, the maximum width of the recess RP is 147 nm in a case where the number of times of performing the sequence in step ST2 is 0, that is, in a case where step ST2 is not performed. Meanwhile, the maximum width of the recess RP is 135 nm in a case where the number of times of performing the sequence in step ST2 is 6. Accordingly, it is confirmed that the occurrence of bowing caused from the plasma etching of the organic film OF is suppressed by performing step ST3 after step ST2 is performed.

According to an embodiment of the present disclosure, it is possible to suppress the occurrence of bowing caused from a plasma etching of an organic film by using a protective film that is easily removed together with the organic film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method, comprising:
   (a) performing a plasma etching on an organic film to form a recess in the organic film, the organic film having a mask formed thereon and being formed on another film;
   (b) forming an organic protective film on a side wall surface of the recess in the organic film;
   (c) performing an additional plasma etching on the organic film after (b) is performed;
   (d) performing a plasma etching on the another film after the another film is partially exposed by (c); and
   (e) forming an additional organic protective film on another side wall surface of the recess in the another film after (d), wherein (d) is additionally performed after (e) is performed.

2. The etching method according to claim 1, wherein the mask contains silicon.

3. The etching method according to claim 1, further comprising:
   (f) performing an ashing process to remove the organic film after (d) is performed.

4. The etching method according to claim 1, wherein (a) is stopped before the bottom of the recess reaches the boundary between the another film and the organic film.

5. The etching method according to claim 1, wherein the material of the organic protective film is different from the material of the organic film.

6. The etching method according to claim 1, wherein a density of the organic protective film is higher than a density of the organic film.

7. The etching method according to claim 1, wherein the organic protective film does not contain silicon.

8. The etching method according to claim 1, wherein the organic protective film is not formed on the bottom of the recess.

9. The etching method according to claim 1, wherein a process including (a), (b), and (c) is performed using a substrate processing system including a plurality of processing modules.

10. The etching method according to claim 1, wherein (b) and (c) are alternately repeated.

11. The etching method according to claim 10, further comprising:
    (g) removing the organic protective film after (c) is performed and before (b) is repeated.

12. The etching method according to claim 1, wherein (b) is started when an aspect ratio, of a depth of the recess divided by a width of the recess, is 5 or lower.

13. The etching method according to claim 12, wherein the organic protective film is conformally formed on a surface of a substrate, which includes the organic film, after (a) is performed.

14. An etching method, comprising:
    (a) performing a plasma etching on an organic film to form a recess in the organic film, the organic film having a mask formed thereon and being formed on another film;
    (b) forming an organic protective film on a side wall surface of the recess in the organic film;
    (c) performing an additional plasma etching on the organic film after (b) is performed;
    (d) performing a plasma etching on the another film after the another film is partially exposed by (c);
    (e) performing an ashing process to remove the organic film after (d) is performed;
    (f) forming an additional organic protective film on another side wall surface of the recess in the another film, after (d) is performed, wherein
    (d) is additionally performed after (f) is performed,
    (b) is started when an aspect ratio, of a depth of the recess divided by a width of the recess, is 5 or lower, and
    the organic protective film is conformally formed on a surface of a substrate, which includes the organic film, after (a) is performed.

15. An etching method, comprising:
    (a) providing a substrate including a silicon-containing film, an organic film formed on the silicon-containing film, and a mask formed on the organic film;
    (b) forming a recess on the organic film by etching the organic film using plasma generated from an oxygen-containing gas;
    (c) forming an organic protective film on a side wall defining the recess;
    (d) performing an additional plasma etching on the organic film after (c) is performed;
    (e) alternately repeating (b) and (c); and
    (f) etching the silicon-containing film by plasma generated from fluorocarbon gas after the silicon-containing film is partially exposed by (d) is performed, wherein (b) is stopped before the bottom of the recess reaches the boundary between the silicon-containing film and the organic film, the organic film is a spin-on carbon film or an amorphous carbon film, the organic film has a thickness of 3 μm or more, the mask is an antireflection film containing silicon, and the material of the organic protective film is different from the material of the organic film.

16. The etching method according to claim 15, wherein (b) further comprises:
 (b1) adsorbing a first organic compound onto the surface of the substrate by supplying a first precursor gas containing the first organic compound to the substrate, and
 (b2) forming an organic protective film using a polymerization of the first organic compound and a second organic compound by supplying a second precursor gas containing the second organic compound to the substrate, the second organic compound being different from the first organic compound.

17. The etching method according to claim 16, wherein during (b), the substrate is heated to cause the polymerization of the first organic compound and the second organic compound.

18. The etching method according to claim 15, wherein (b) further comprises:
 (b3) adsorbing a precursor organic compound onto the surface of the substrate by supplying a first gas containing the precursor organic compound to the substrate, and
 (b4) forming the organic protective film using a reaction between a second gas and the precursor organic compound by supplying the second gas to the substrate, and
 the second gas includes at least one selected from the group consisting of a gas of a compound having an NH group, a gas of a compound having a hydroxyl group, a mixed gas of $N_2$ and $H_2$, Ar gas, $H_2O$ gas, and a mixed gas of $H_2$ and $O_2$.

19. The etching method according to claim 18, wherein in (b4), plasma is generated from the second gas, and the organic protective film is formed by the reaction between chemical species from the plasma and the precursor organic compound.

* * * * *